(12) United States Patent
Yu et al.

(10) Patent No.: US 11,895,842 B2
(45) Date of Patent: Feb. 6, 2024

(54) NONVOLATILE MEMORY DEVICE HAVING CELL ON PERIPHERY STRUCTURE

(71) Applicant: SAMSUNG ELECTRONICS CO., LTD., Suwon-si (KR)

(72) Inventors: Changyeon Yu, Hwaseong-si (KR); Pansuk Kwak, Goyang-si (KR)

(73) Assignee: SAMSUNG ELECTRONICS CO, LTD., Suwon-si (KR)

(*) Notice: Subject to any disclaimer, the term of this patent is extended or adjusted under 35 U.S.C. 154(b) by 419 days.

(21) Appl. No.: 17/345,832

(22) Filed: Jun. 11, 2021

(65) Prior Publication Data
US 2022/0115393 A1 Apr. 14, 2022

(30) Foreign Application Priority Data
Oct. 14, 2020 (KR) .......................... 10-2020-0132567

(51) Int. Cl.
| | |
|---|---|
| G11C 16/04 | (2006.01) |
| H10B 43/40 | (2023.01) |
| H01L 21/66 | (2006.01) |
| H01L 23/535 | (2006.01) |
| H10B 41/27 | (2023.01) |
| H10B 41/41 | (2023.01) |
| H10B 43/27 | (2023.01) |
| G11C 16/24 | (2006.01) |

(52) U.S. Cl.
CPC ............ *H10B 43/40* (2023.02); *H01L 22/34* (2013.01); *H01L 23/535* (2013.01); *H10B 41/27* (2023.02); *H10B 41/41* (2023.02); *H10B 43/27* (2023.02); *G11C 16/0483* (2013.01); *G11C 16/24* (2013.01)

(58) Field of Classification Search
CPC ............................ G11C 16/0483; G11C 16/24
See application file for complete search history.

(56) References Cited

U.S. PATENT DOCUMENTS

| | | |
|---|---|---|
| 7,707,472 B1 | 4/2010 | Dastidar |
| 9,135,111 B2 | 9/2015 | Oh et al. |
| 9,806,093 B2 | 10/2017 | Toyama et al. |
| 9,941,009 B2 | 4/2018 | Lim et al. |
| 10,446,565 B2 | 10/2019 | Oh et al. |
| 10,566,345 B2 | 2/2020 | Kanamori et al. |
| 10,593,690 B2 | 3/2020 | Lu et al. |
| 10,672,791 B2 | 6/2020 | Lim et al. |
| 2012/0020161 A1 | 1/2012 | Haukness |

(Continued)

*Primary Examiner* — Pho M Luu
(74) *Attorney, Agent, or Firm* — F. CHAU & ASSOCIATES, LLC

(57) ABSTRACT

A nonvolatile memory device having a cell over periphery (COP) structure includes a first sub memory plane and a second sub memory plane disposed adjacent to the first sub memory plane a row direction. A first vertical contact region is disposed in the cell region of the first sub memory plane and a second vertical contact region is disposed in the cell region of the second sub memory plane. A first overhead region is disposed in the cell region of the first sub memory plane and adjacent to the second vertical region in the row direction, and a second overhead region is disposed in the cell region of the second sub memory plane and adjacent to the first vertical region in the row direction. Cell channel structures are disposed in a main region of the cell region.

20 Claims, 26 Drawing Sheets

(56) References Cited

U.S. PATENT DOCUMENTS

| | | |
|---|---|---|
| 2016/0307910 A1 | 10/2016 | Son et al. |
| 2022/0115393 A1* | 4/2022 | Yu .......................... H10B 43/10 |
| 2023/0154527 A1* | 5/2023 | Song .................... G11C 7/1096 |
| | | 365/189.011 |
| 2023/0171964 A1* | 6/2023 | Kim ....................... G11C 16/24 |
| | | 257/314 |

* cited by examiner

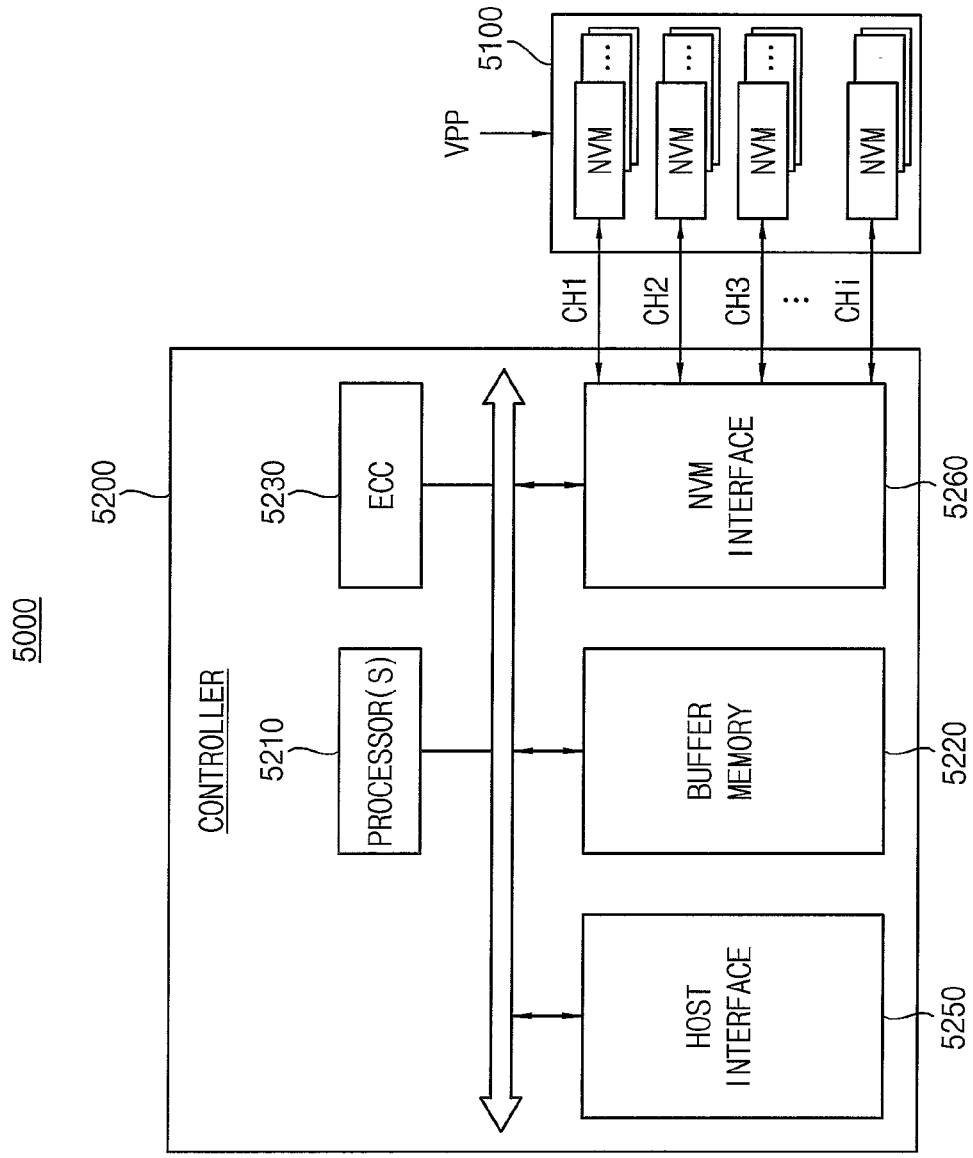

NONVOLATILE MEMORY DEVICE HAVING CELL ON PERIPHERY STRUCTURE

CROSS-REFERENCE TO RELATED APPLICATION

This U.S. non-provisional application claims priority under 35 USC § 119 to Korean Patent Application No. 10-2020-0132567, filed on Oct. 14, 2020, in the Korean Intellectual Property Office (KIPO), the disclosure of which is incorporated by reference herein in its entirety.

TECHNICAL FIELD

The present inventive concepts relate generally to semiconductor integrated circuits, and more particularly to a nonvolatile memory device having a cell over periphery (COP) structure.

DISCUSSION OF THE RELATED ART

Recently, there has been demand for memory devices with large memory capacities, smaller size, and increased integration. A vertical memory device or a three-dimensional memory device may include a plurality of memory cells stacked vertically in order to realize a high degree of integration. In the vertical memory device, a channel may protrude or may extend vertically from a surface of a substrate, and gate lines and insulation layers surrounding the vertical channel may be repeatedly stacked.

Even though such vertical structure is adopted, a size reduction of the vertical memory device is limited due to vertical contacts for connecting a memory cell array and peripheral circuits such as a page buffer, a row decoder, etc. Despite utilizing a vertical structure to increase integration, there may be limits on size reduction of the memory device due to the use of vertical contacts for connecting a memory cell array and peripheral circuits such as a page buffer, a row decoder, and others.

SUMMARY

The present disclosure relates to a nonvolatile memory device having an efficient COP structure.

According to example embodiments, a nonvolatile memory device having a cell over periphery (COP) structure in which peripheral circuits are disposed in a peripheral region and a memory cell array is disposed in a cell region ager the peripheral region includes: a first sub memory plane, a second sub memory plane disposed adjacent to the first sub memory plane in a row direction, a first vertical contact region disposed in the cell region of the first sub memory plane and disposed closer to a first end portion in a column direction of the cell region, a second vertical contact region disposed in the cell region of the second sub memory plane and disposed closer to a second end portion where the second end portion is opposite the first end portion on a column direction, a first overhead region disposed in the cell region of the first sub memory plane and adjacent to the second vertical region in the row direction, a second overhead region disposed in the cell region of the second sub memory plane and adjacent to the first vertical region in the row direction, a vertical contacts disposed in the first vertical contact region and the second contact region and extending in a vertical direction to penetrate the cell region, cell channel structures disposed in a main region cell region, each cell channel structure including a string selection transistor, memory cells and a ground selection transistor.

According to example embodiments, a nonvolatile memory device having a COP structure in which peripheral circuits are disposed in a peripheral region and a memory cell array is disposed in a cell region over the peripheral region includes: a first sub memory plane, a second sub memory plane disposed adjacent to the first sub memory plane in a row direction, a first vertical contact region disposed in the cell region of the first sub memory plane and disposed closer to a first end portion in a column direction of the cell region, a second vertical contact region disposed in the cell region of the second sub memory plane and disposed closer to a second end portion where the second end portion is opposite the first end portion on a column direction, a first overhead region disposed in the cell region of the first sub memory plane and adjacent to the second vertical region in the row direction, a second overhead region disposed in the cell region of the second sub memory plane and adjacent to the first vertical region in the row direction, bitlines disposed at a top portion in the vertical direction of the cell region, arranged in the row direction and extending in the column direction, a source line disposed at a bottom portion in the vertical direction of the cell region and extending in the column direction, a first page buffer region disposed under the first vertical contact region, a second page buffer region disposed under the second vertical contact region, page buffers disposed in the first page buffer region and the second page buffer region, bitline vertical contacts disposed in the first vertical contact region and the second contact region and extending in a vertical direction to connect the bitlines and the page buffers, respectively, cell channel structures disposed in the cell region except the first vertical contact region and the second vertical contact region, each cell channel structure including a string selection transistor, memory cells and a ground selection transistor, half memory blocks disposed in the first overhead region and the second overhead region, each half memory block including the cell channel structures corresponding to a half of a page, where a page is a unit of a read operation and a write operation, and memory blocks disposed in the cell region except the first vertical contact region, the second vertical contact region, the first overhead region and the second overhead region, each memory block including the cell channel structures corresponding to the page.

According to example embodiments, a nonvolatile memory device includes first metals disposed in a cell region, second metal pads disposed in a peripheral region under the cell region wherein the peripheral region is vertically connected to the cell region by the first metal pads and the second metal pads, a first sub memory plane, a second sub memory plane disposed adjacent to the first sub memory plane in a row direction, a first vertical contact region disposed in the cell region of the first sub memory plane and disposed closer to a first end portion in a column direction of the cell region, a second vertical contact region disposed in the cell region of the second sub memory plane and disposed closer to a second end portion where the second end portion is opposite the first end portion on a column direction, a first overhead region disposed in the cell region of the first sub memory plane and adjacent to the second vertical region in the row direction, a second overhead region disposed in the cell region of the second sub memory plane and adjacent to the first vertical region in the row direction, vertical contacts disposed in the first vertical contact region and the second contact region and extending in a vertical direction to penetrate the cell region, and cell channel structures disposed in a main region of the cell region, each cell channel structure including a string selection transistor, memory cells and a ground selection transistor.

The nonvolatile memory device according to example embodiments may have a reduced size by adopting the COP structure in which the peripheral circuit is formed on the semiconductor substrate and the memory cell array is stacked on the peripheral circuit.

In addition, the nonvolatile memory device according to example embodiments may increase memory capacity per unit area by forming the half memory blocks in the overhead regions that are created adjacent to the vertical contacts.

BRIEF DESCRIPTION OF THE DRAWINGS

The above and other aspects and features of the present disclosure will become more apparent by describing in detail example embodiments thereof with reference to the attached drawings, in which:

FIG. 27 is a block diagram illustrating a solid state disk or solid state drive (SSD) according to example embodiments.

DETAILED DESCRIPTION OF THE EMBODIMENTS

Figure 1:
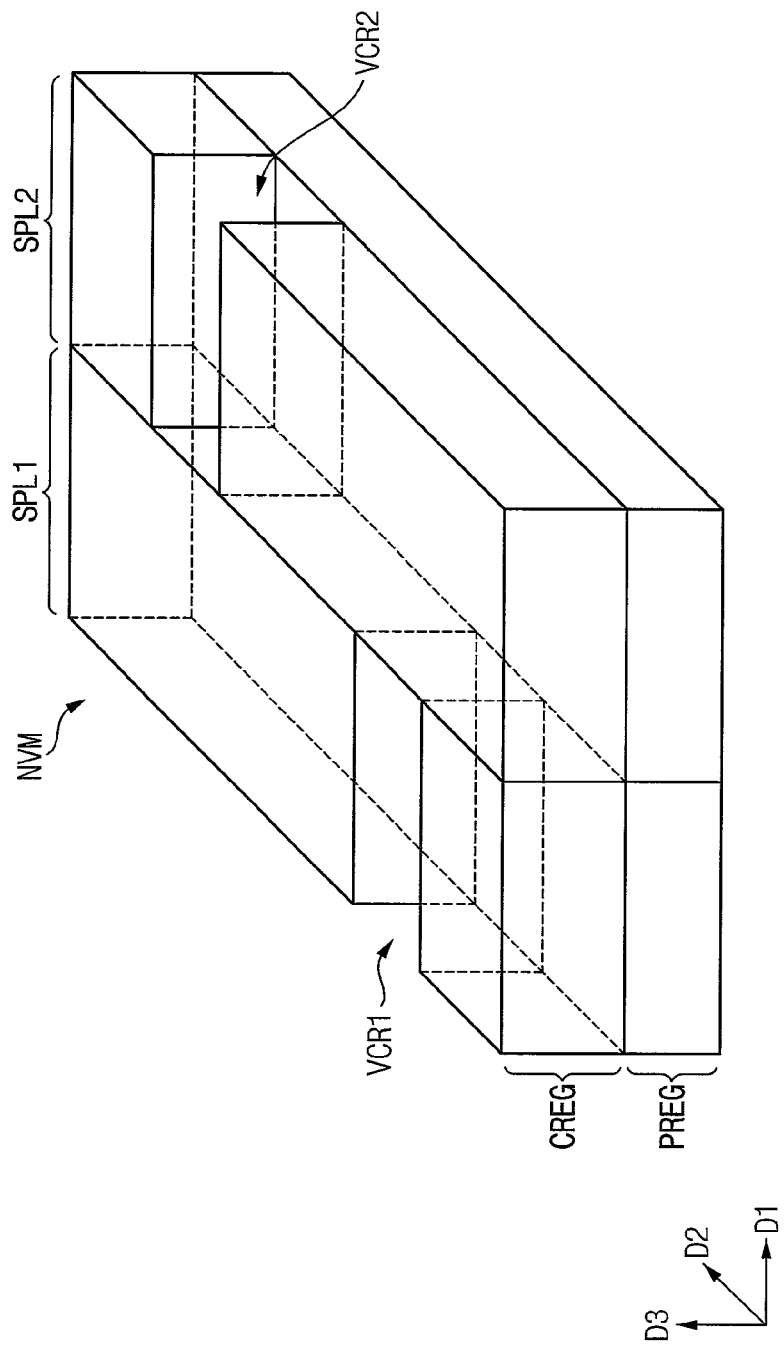
FIG. 1 is a perspective view illustrating a nonvolatile memory device according to example embodiments.

Hereinafter, various example embodiments will be described in detail with reference to the accompanying drawings. Like reference symbols in the drawings may denote like elements, and to the extent that a description of an element has been omitted, it may be understood that the element is at least similar to corresponding elements that are described elsewhere in the specification. Additionally, description of a singular element may apply to a plurality of the same elements, unless the context of the description or referenced drawings indicates otherwise.

In this disclosure, a vertical direction D3 indicates a direction perpendicular to an upper surface of a semiconductor substrate, and a first horizontal direction D1 and a second horizontal direction D2 indicate two directions parallel to the upper surface of the semiconductor substrate. The first horizontal direction D1 and the second horizontal direction D2 may be substantially perpendicular. The first horizontal direction D1 may be referred to as a row direction or a first direction, the second horizontal direction D2 may be referred to as a column direction or a second direction and the vertical direction D3 may be referred to as a third direction. For example, the first direction D1 may be a direction along which rows extend and along which columns are arranged, and the second direction D2 may be a direction along which columns extend and along which rows are arranged. The direction indicated by an arrow in figures and the opposite direction may be considered as the same direction.

Figure 2:
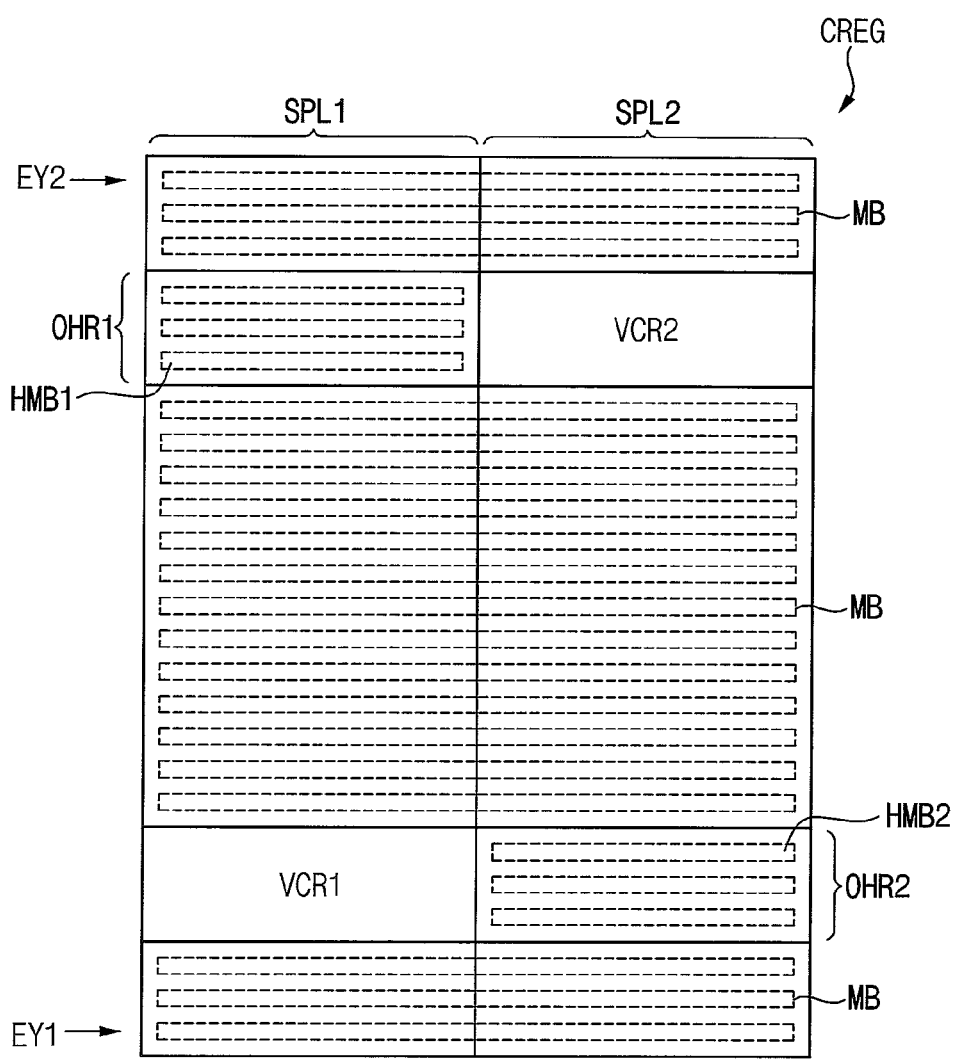
FIG. 2 is a plan view illustrating a layout of a nonvolatile memory device according to example embodiments.
Figure 2:
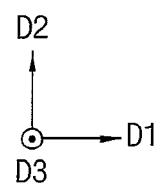

FIG. 1 is a perspective view of a nonvolatile memory device according to example embodiments, and FIG. 2 is a plan view of a layout of a nonvolatile memory device according to example embodiments.

Referring to FIGS. 1 and 2, a nonvolatile memory device NVM has a cell over periphery (COP) structure in which peripheral circuits are disposed in a peripheral region PREG and a memory cell array is disposed in a cell region CREG over the peripheral region PREG.

FIGS. 1 and 2 illustrate the nonvolatile memory device NVM including a single memory plane or a single mat for convenience of illustration and description. In some example embodiments, the nonvolatile memory device NVM may include a plurality of memory planes arranged in the row direction D1 and or the column direction D2.

Each memory plane of the nonvolatile memory device may include a first sub memory plane SPL1 and a second sub memory plane SPL2 disposed adjacent to the first sub memory plane SPL1 in the row direction D1.

A first vertical contact region VCR1 may be disposed in the cell region CREG of the first sub memory plane SPL1 and a second vertical contact region VCR2 may be disposed in the cell region CREG of the second sub memory plane SPL2. The first vertical contact region VCR1 may be disposed near a first end portion EY1 in a column direction D2 of the cell region CREG and the second vertical contact region VCR2 may be disposed near a second end portion EY2 in the column direction D2 of the cell region CREG. For example, the first vertical contact region VCR1 is closer to the first end portion EY1 than the second end portion EY2, and the second vertical contact region VCR2 is closer to the second end portion EY2 than the first end portion EY1.

The cell region may include a first vertical contact region VCR1 and a second vertical contact region VCR2 as described above, and may further include a main region, where the main region constitutes the remaining portion of the cell region other than the first vertical contact region VCR1 and the second vertical contact region VCR2.

A first overhead region OHR1 may be disposed in the cell region CREG of the first sub memory plane SPL1 and a second overhead region OHR2 may be disposed in the cell region CREG of the second sub memory plane SPL2. The first overhead region OHR1 may be adjacent to the second vertical region second vertical contact region VCR2 in the row direction D1, and the second overhead region OHR2 may be adjacent to the first vertical region VCR1 in the row direction D1.

As will be described bellow, vertical contacts may be disposed in the first vertical contact region VCR1 and the second contact region VCR2 such that the vertical contacts may extend in the vertical direction D3 to penetrate the cell region CREG. In some example embodiments, as will be described with reference to FIGS. 1 through 19, the vertical contacts may include bitline vertical contacts connecting bitlines and page buffers. In some example embodiments, the vertical contacts may include voltage vertical contacts providing voltages. For example, as will be described below with reference to FIGS. 20 through 22, the vertical contacts may include source line vertical contacts to provide a source voltage to a source line. As will be described below, the arrangement of the vertical contacts in the vertical contact regions VCR1 and VCR2 adjacent to the first and second overhead regions OHR1 and OHR2 may allow for an increased memory capacity per unit area.

Cell channel structures may be disposed in regions of the cell region CREG excluding the first vertical contact region VCR1 and the second vertical contact region VCR2. For example, there may be gaps in the cell channel structures in the first vertical contact region VCR1 and the second vertical contact region VCR2, while the cell channel structures are disposed in a main region of the cell region CREG. Each cell channel structure ma include a string selection transistor, memory cells and a ground selection transistor. Each cell channel structure may be connected between a corresponding bitline and the source line.

As illustrated in FIG. 2, the first overhead region OHR1 may include one or more first half memory black HMB1 and the second overhead region OHR2 may include one or more second half memory blocks HMB2. As will be described below with reference to FIG. 3, each of the half memory blocks HMB1 may include the cell channel structures corresponding to a first half of a page that is a unit of a read operation and a write operation, and each of the second half memory blocks HMB2 may include the cell channel structures corresponding to a second half of the page.

The cell region, other than the first vertical contact region VCR1, the second vertical contact region VCR2, the first overhead region OHR1 and the second overhead region OHR2, may include memory blocks. For example, "memory blocks" may refer to whole memory blocks, which correspond to a full page, where a full page refers to a unit of a read operation and a write operation. Each of the memory blocks may include the cell channel structures corresponding to the page.

As will be described below with reference to FIG. 16, one of the first half memory blocks HMB1 and one of the second half memory blocks HMB2 may be selected simultaneously based on a same row address. Through an address mapping, the first half memory block HMB1 and the second half memory block HMB2 which are selected simultaneously may correspond to the page.

A row-directional length and a column-directional length of the first vertical contact region VCR1 may be equal to a row-directional length and a column-directional length of the second vertical contact region VCR2, respectively. In addition, a number of the first half memory blocks HMB1 may be equal to a number of the second half memory blocks HMB2. For example, the first sub memory plane SPL1 may be symmetric in the column direction D2 with the second sub memory plane SPL2. Because of this symmetric structure, the operational characteristics of the first sub memory plane SPL1 and the second sub memory plane SPL2 may be uniform.

FIG. 2 illustrates the three first half memory blocks HMB1 in the first overhead region OHR1 and the three second half memory blocks HMB2 in the second overhead region OHR2. However, the number of the half memory blocks in each overhead region may be determined variously depending on the configuration of the nonvolatile memory device NVM.

In some example embodiments, the first half memory blocks HMB1 and the second half memory blocks HMB2 may be set as test blocks configured to test operational characteristics of the nonvolatile memory device. While the memory blocks store data, the test blocks may be used, for example, to test voltage characteristics of the nonvolatile memory device NVM. The test blocks may be used only in the test operation and then disregarded during normal operations of the nonvolatile memory device NVM.

In some example embodiments, the first half memory blocks HMB1 and the second half memory blocks HMB2 may be used as spare blocks configured to replace failed memory cells in the cell region CREG. The replacement of the failed memory cells in a repair operation may be performed by various schemes known to persons skilled in the art.

In some example embodiments, the first half memory blocks HMB1 and the second half memory blocks HMB2 may be used as special blocks configured to store meta data for controlling the nonvolatile memory device NVM. The meta data may include information on methods and regulations for controlling the nonvolatile memory device NVM. For example, the meta data may include mapping relations between logical addresses assigned to the nonvolatile memory device NVM and physical addresses of the nonvolatile memory device NVM. A memory controller may convert the logical address provided from a host device to the physical address of the nonvolatile memory device NVM by referring to the meta data to perform a write operation, a read operation, an erase operation and a background operation of the nonvolatile memory device NVM based on the physical address.

Figure 3:
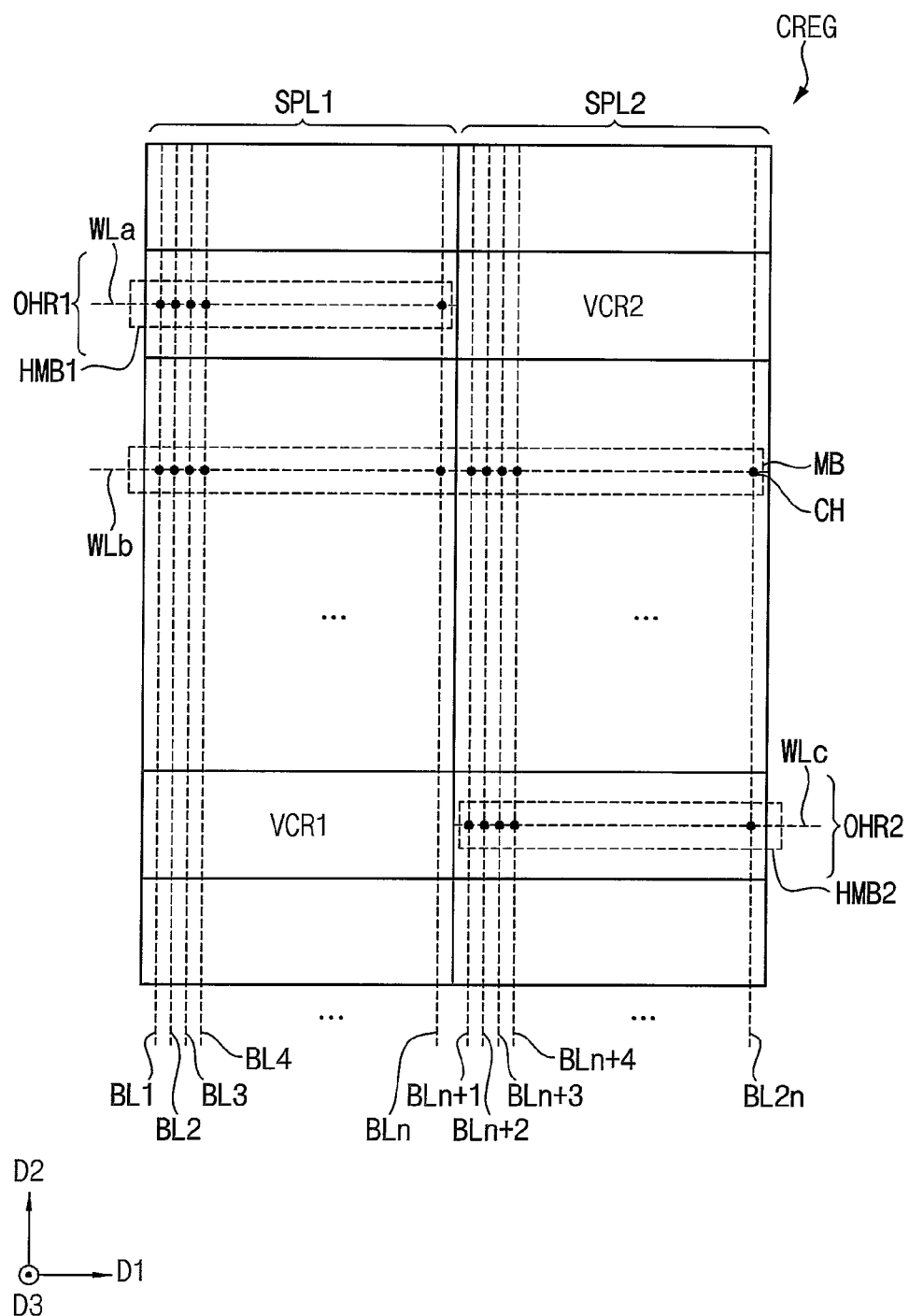
FIG. 3 is a diagram illustrating memory blocks and half memory blocks disposed in a cell region in FIG. 2.

FIG. 3 is a diagram of memory blocks and half memory blocks disposed in a cell region in FIG. 2. To the extent that a description of an element has been omitted, it may be assumed that the element is at least similar to corresponding elements that have been described elsewhere in the instant specification.

Referring to FIG. 3, the cell region CREG may include the first half memory blocks HMB1 in the first overhead region OHR1, the second half memory blocks HMB2 in the second overhead region OHR2, and the memory blocks in the region excluding the first vertical contact region VCR1, the second vertical contact region VCR2, the first overhead region OHR1 and the second overhead region OHR2.

FIG. 3 illustrates one first half memory block HMB1, one second half memory block HMB2 and one memory block MB. In addition, FIG. 3 illustrates one wordline among wordlines included in each of the one first half memory block HMB1, the one second half memory block HMB2 and the one memory block MB. However, the number of each component may vary across embodiments.

The first sub memory plane SPL1 may include n bitlines BL1 through BLn corresponding to a first half of a page size 2n, and the second sub memory plane SPL2 may include n bitlines BLn+1 through BL2n corresponding to a second half of the page size 2n. For example, the page size 2n may be 4 KB, 8 KB, 16 KB, 32 KB, etc.

In the memory block MB, the cell channel structures CH corresponding to the page size 2n may be commonly connected to each wordline WLb. The 2n cell channel structures CH connected to each wordline WLb may each be connected to the 2n bitlines BL1 through BL2n. In other words, the memory block MB may include the cell channel structures CH corresponding to each page.

In the first half memory block HMB1, the cell channel structures CH corresponding to the first half of the page size 2n may be commonly connected to each wordline WLa. The n cell channel structures CH connected to each wordline WLa may each be connected to the n bitlines BL1 through BLn. For example, the first half memory block HMB1 may include the cell channel structures CH corresponding to the first half of each page.

In the second half memory block HMB2, the cell channel structures CH corresponding to the second half of the page size 2n may be commonly connected to each wordline WLc. The n cell channel structures CH connected to each wordline WLc may each be connected to the n bitlines BLn+1 through BL2n. For example, the second half memory block HMB2 may include the cell channel structures CH corresponding to the second half of each page.

Hereinafter, example configurations and operations of a nonvolatile memory device according to example embodiments are described with reference to FIGS. 4 through 6, and example COP structures of a nonvolatile memory device according to example embodiments are described with reference to FIGS. 7 through 9.

Figure 4:
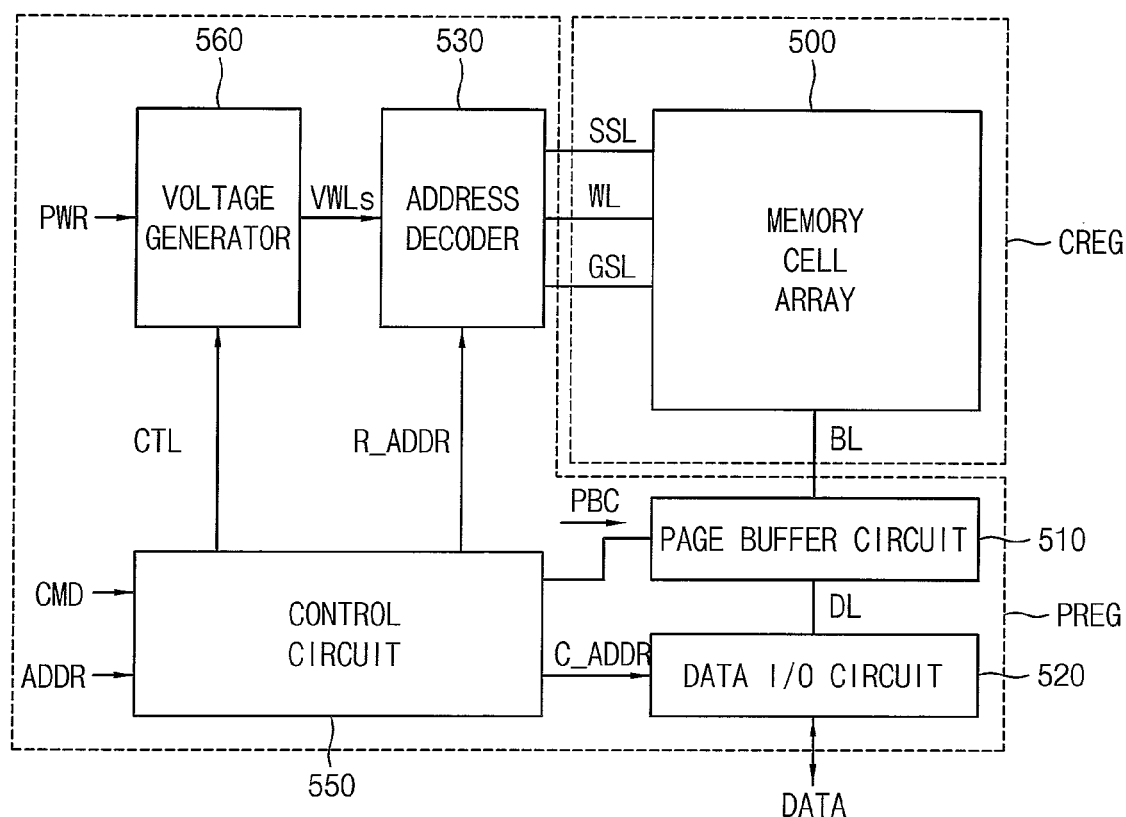
FIG. 4 is a block diagram illustrating a nonvolatile memory device according to example embodiments.

FIG. 4 is a block diagram of a nonvolatile memory device according to example embodiments.

Referring to FIG. 4, a nonvolatile memory device 1000 may include a memory cell array 500, a page buffer circuit 510, a data input/output (I/O) circuit 520, an address decoder 530, a control circuit 550 and a voltage generator 560. The memory cell array 500 may be disposed in the cell region CREG in FIG. 1, and the page buffer circuit 510, the data I/O circuit 520, the address decoder 530, the control circuit 550 and the voltage generator 560 may be disposed in the peripheral region PREG in FIG. 1.

The memory cell array 500 may be coupled to the address decoder 530 through string selection lines SSL, wordlines WL, and ground selection lines GSL. In addition, the memory cell array 500 may be coupled to the page buffer circuit 510 through a bitlines BL. The memory cell array 500 may include a memory cells coupled to the wordlines WL and the bitlines BL. In some example embodiments, the memory cell array 500 may be a three-dimensional memory cell array, which is formed on a substrate in a three-dimensional structure (for example, a vertical structure). In this case, the memory cell array 500 may include cell strings (e.g., NAND strings) that are vertically oriented such that at least one memory cell is overlapped vertically with another memory cell.

The control circuit 550 may receive a command (signal) CMD and an address (signal) ADDR from a memory controller. Accordingly, the control circuit 550 may control erase, program and read operations of the nonvolatile memory device 1000 in response to (or based on) at least one of the command signal CMD and the address signal ADDR. An erase operation may include performing a sequence of erase loops, and a program operation may include performing a sequence of program loops. Each program loop may include a program operation and a program verification operation. Each erase loop may include an erase operation and an erase verification operation. The read operation may include a normal read operation and data recover read operation.

For example, the control circuit 550 may generate the control signals CTL used to control the operation of the voltage generator 560, and may generate the page buffer control signal PBC for controlling the page buffer circuit 510 based on the command signal CMD, and generate the row address R_ADDR and the column address C_ADDR based on the address signal ADDR. The control circuit 550 may provide the row address R_ADDR to the address decoder 530 and provide the column address C_ADDR to the data I/O circuit 520.

The address decoder 530 may be coupled to the memory cell array 500 through the string selection lines SSL, the wordlines WL, and the ground selection lines GSL. During the program operation or the read operation, the address decoder 530 may determine or select one of the wordlines WL as a selected wordline and determine the remaining wordlines WL except for the selected wordline as unselected wordlines based on the row address R_ADDR.

During the program operation or the read operation, the address decoder 530 may determine one of the string selection lines SSL as a selected string selection line and determine rest of the string selection lines SSL except for the selected string selection line as unselected string selection lines based on the row address R_ADDR.

The voltage generator 560 may generate wordline voltages VWL, which are required for the operation of the memory cell army 500 of the nonvolatile memory device 1000, based on the control signals CTL. The voltage generator 560 may receive power PWR from the memory controller. The wordline voltages VWL may be applied to the wordlines WL through the address decoder 530.

For example, during the erase operation, the voltage generator 560 may apply an erase voltage to a well and/or a common source line of a memory block and apply an erase permission voltage (e.g., a ground voltage) to all or a portion of the wordlines of the memory block based on an erase address. During the erase verification operation, the voltage generator 560 may apply an erase verification voltage simultaneously to all of the wordlines of the memory block or sequentially (e.g., one by one) to the wordlines.

For example, during the program operation, the voltage generator 560 may apply a program voltage to the selected wordline and may apply a program pass voltage to the unselected wordlines. In addition, during the program verification operation, the voltage generator 560 may apply a program verification voltage to the first wordline and may apply a verification pass voltage to the unselected wordlines.

During the normal read operation, the voltage generator 560 may apply a read voltage to the selected wordline and may apply a read pass voltage to the unselected wordlines. During the data recover read operation, the voltage generator 560 may apply the read voltage to a wordline adjacent to the selected wordline and may apply a recover read voltage to the selected wordline.

The page buffer circuit 510 may be coupled to the memory cell array 500 through the bitlines BL. The page buffer circuit 510 may include multiple buffers. In some example embodiments, each buffer may be connected to a single bitline. In other example embodiments, each buffer may be connected to two or more bitlines. The page buffer circuit 510 may temporarily store data to be programmed in a selected page or data read out from the selected page of the memory cell array 500.

The data I/O circuit 520 may be coupled to the page buffer circuit 510 through data lines DL. During the program operation, the data I/O circuit 520 may receive program data DATA received from the memory controller and provide the program data DATA to the page buffer circuit 510 based on the column address C_ADDR received from the control circuit 550. Dining the read operation, the data I/O circuit 520 may provide read data DATA, having been read from the memory cell array 500 and stored in the page buffer circuit 510, to the memory controller based on the column address C_ADDR received from the control circuit 550.

In addition, the page buffer circuit 510 and the data I/O circuit 520 may read data from a first area of the memory cell array 500 and write the read data to a second area of the memory cell array 500 (e.g., without transmitting the data to a source external to the nonvolatile memory device 1000, such as to the memory controller). For example, the page buffer circuit 510 and the data I/O circuit 520 may perform a copy-back operation.

Figure 5:
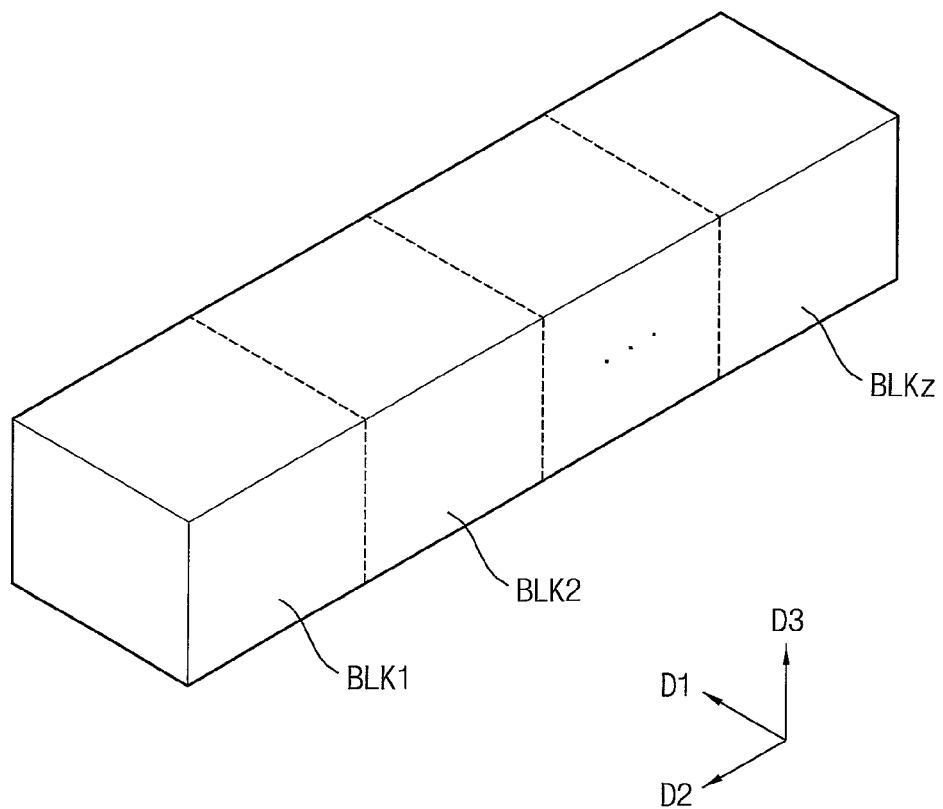
FIG. 5 is a block diagram illustrating a memory cell array included in the nonvolatile memory device of FIG. 4.
Figure 6:
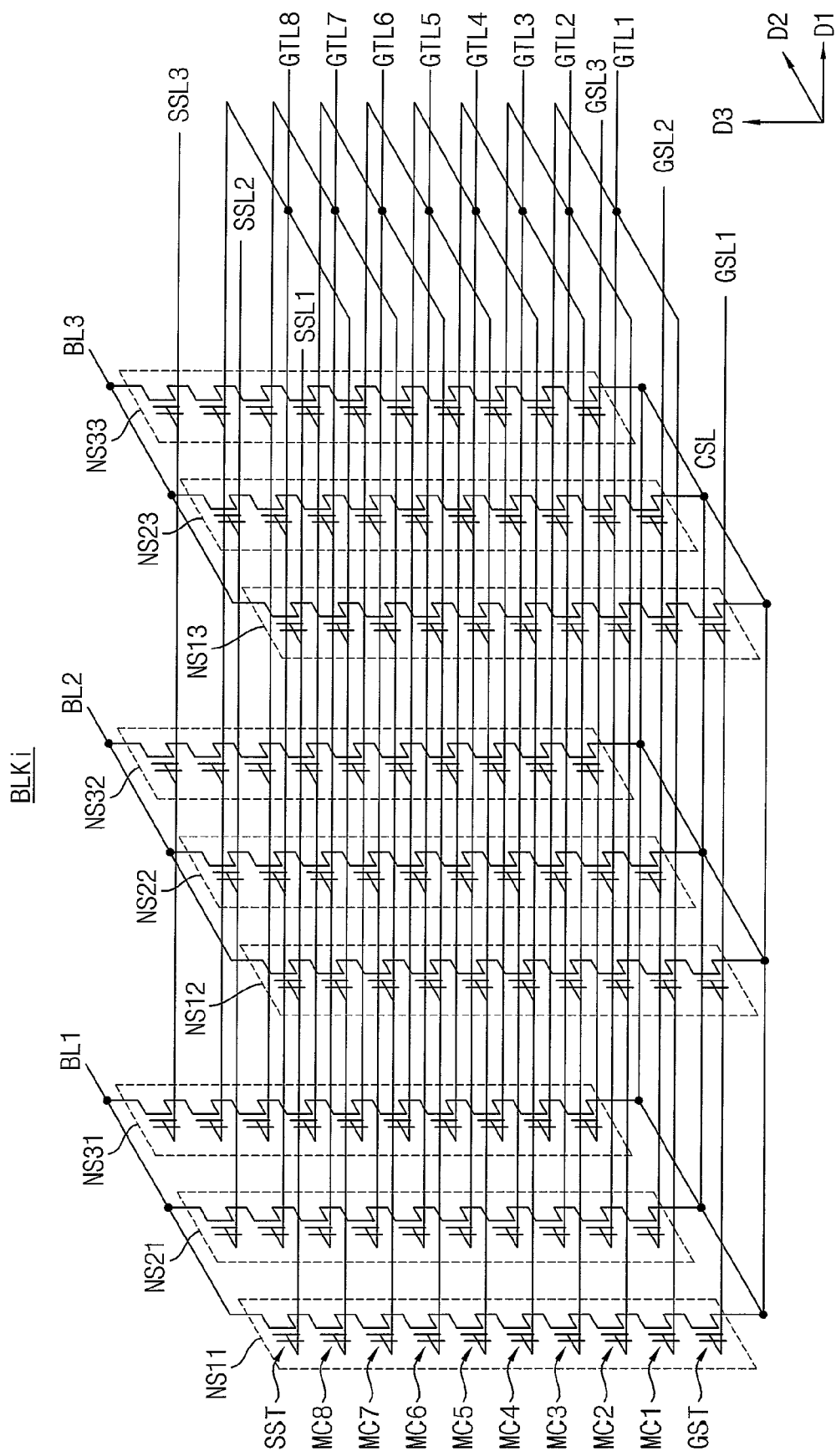
FIG. 6 is a circuit diagram illustrating an equivalent circuit of a memory block included in the memory cell array of FIG. 5.

FIG. 5 is a block diagram of a memory cell array included in the nonvolatile memory device of FIG. 4, and FIG. 6 is a circuit diagram of an equivalent circuit of a memory block included in the memory cell array of FIG. 5.

Referring to FIG. 5, the memory cell array 500 may include memory blocks BLK1 to BLKz. In some example embodiments, the memory blocks BLK1 to BLKz may be selected by the address decoder 430 of FIG. 4. For example, the address decoder 430 may select a particular memory block BLK among the memory blocks BLK1 to BLKz corresponding to a block address.

The memory block BLKi of FIG. 6 may be formed on a substrate in a three-dimensional structure (for example, a vertical structure). For example, NAND strings or cell strings included in the memory block BLKi may be disposed in the vertical direction D3 perpendicular to the upper surface of the substrate.

Referring to FIG. 6, the memory block BLKi may include NAND strings NS11 to NS33 coupled between bitlines BL1, BL2 and BL3 and a common source line CSL. Each of the NAND strings NS11 to NS33 may include a string selection transistor SST, a memory cells MC1 to MC8, and a ground selection transistor GST. In FIG. 6, each of the NAND strings NS11 to NS33 is illustrated to include eight memory cells MC1 to MC8. However, embodiments are not limited thereto. In some embodiments, each of the NAND strings NS11 to NS33 may include any number of memory cells.

Each string selection transistor SST may be connected to a corresponding string selection line (for example, one of SSL1 to SSL3). The memory cells MC1 to MC8 may be connected to corresponding gate lines GL1 to GL8, respectively. The gate lines GTL1 to GTL8 may be wordlines, and some of the gate lines GTL1 to GTL8 may be dummy wordlines. Each ground selection transistor GST may be connected to a corresponding ground selection line (for example, one of GSL1 to GSL3). Each string selection transistor SST may be connected to a corresponding bitline (e.g., one of BL1, BL2 and BL3), and each ground selection transistor GST may be connected to the common source line CSL.

Wordlines WL having the same height may be commonly connected, and the ground selection lines GSL1 to GSL3 and the string selection lines SSL1 to SSL3 may be separated. In FIG. 6, the memory block BLKi is illustrated to be coupled to eight gate lines GTL1 to GTL8 and three bitlines BL1 to BL3. However, example embodiments are not limited thereto. Each memory block in the memory cell array 500 may be coupled to any number of wordlines and any number of bitlines.

Figure 7:
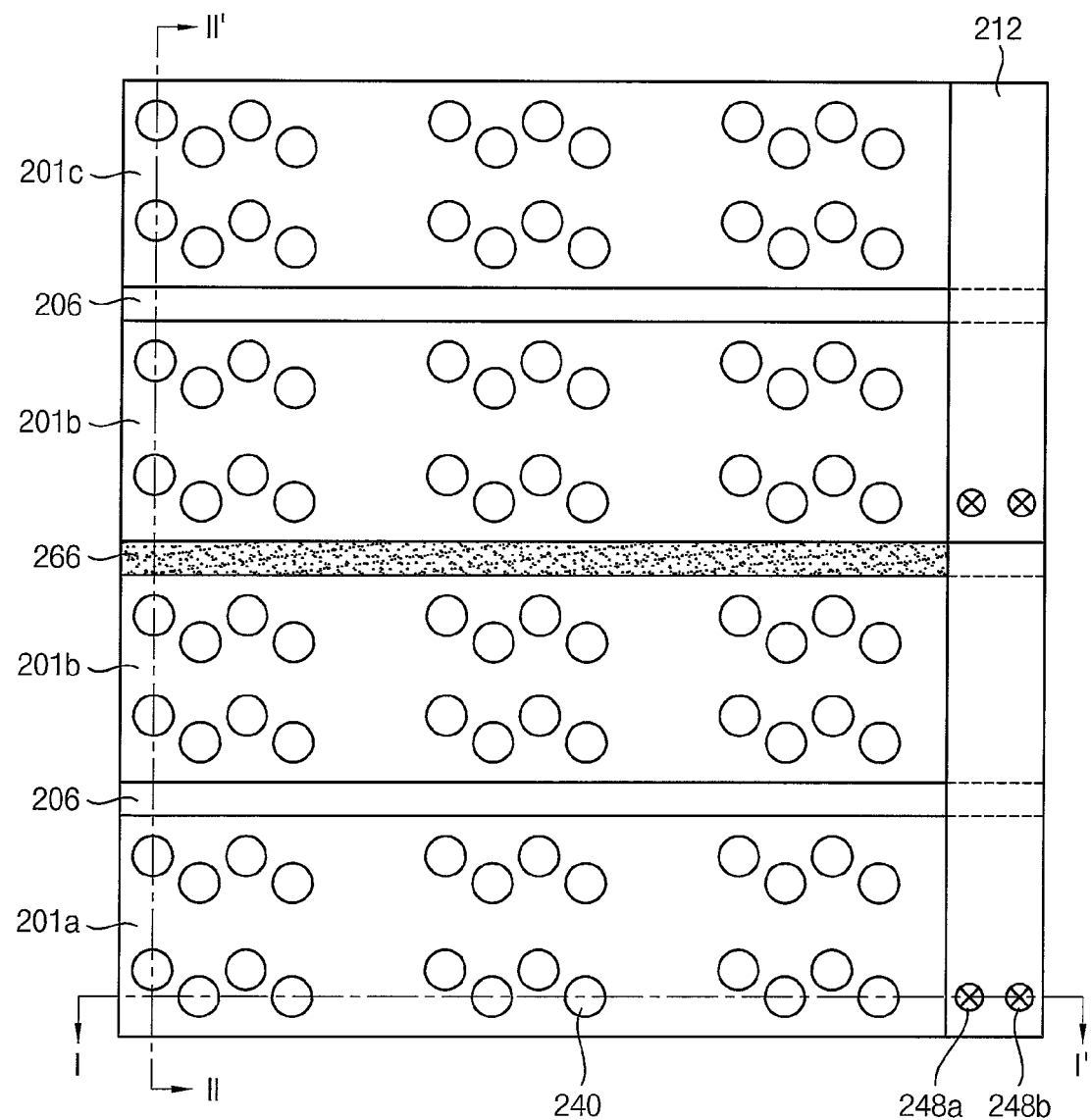
FIG. 7 is a plan view illustrating a nonvolatile memory device according to example embodiments.
Figure 8:
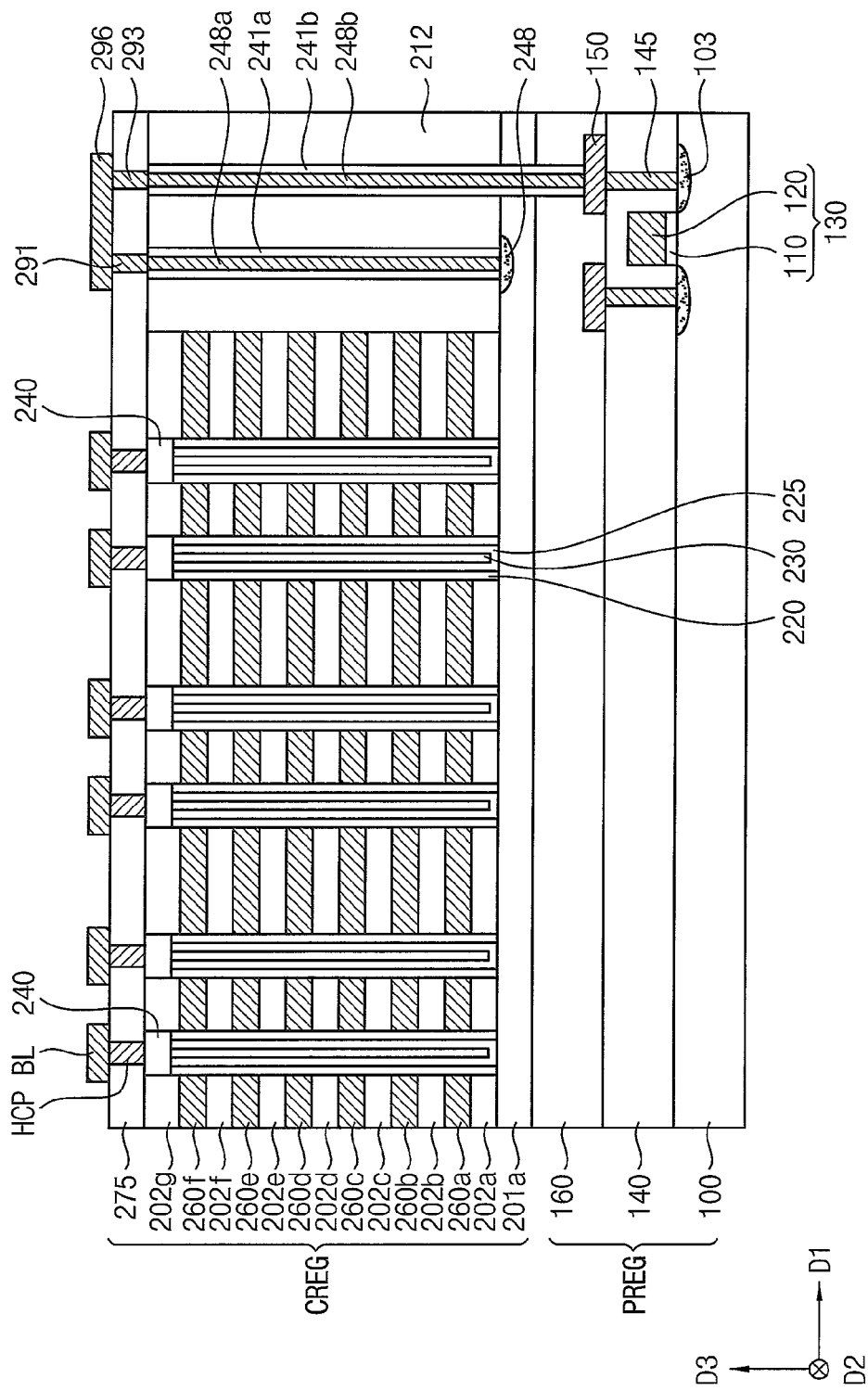
FIGS. 8 and 9 are cross-sectional views taken along lines I-I' and II-II' in FIG. 7, respectively.
Figure 9:
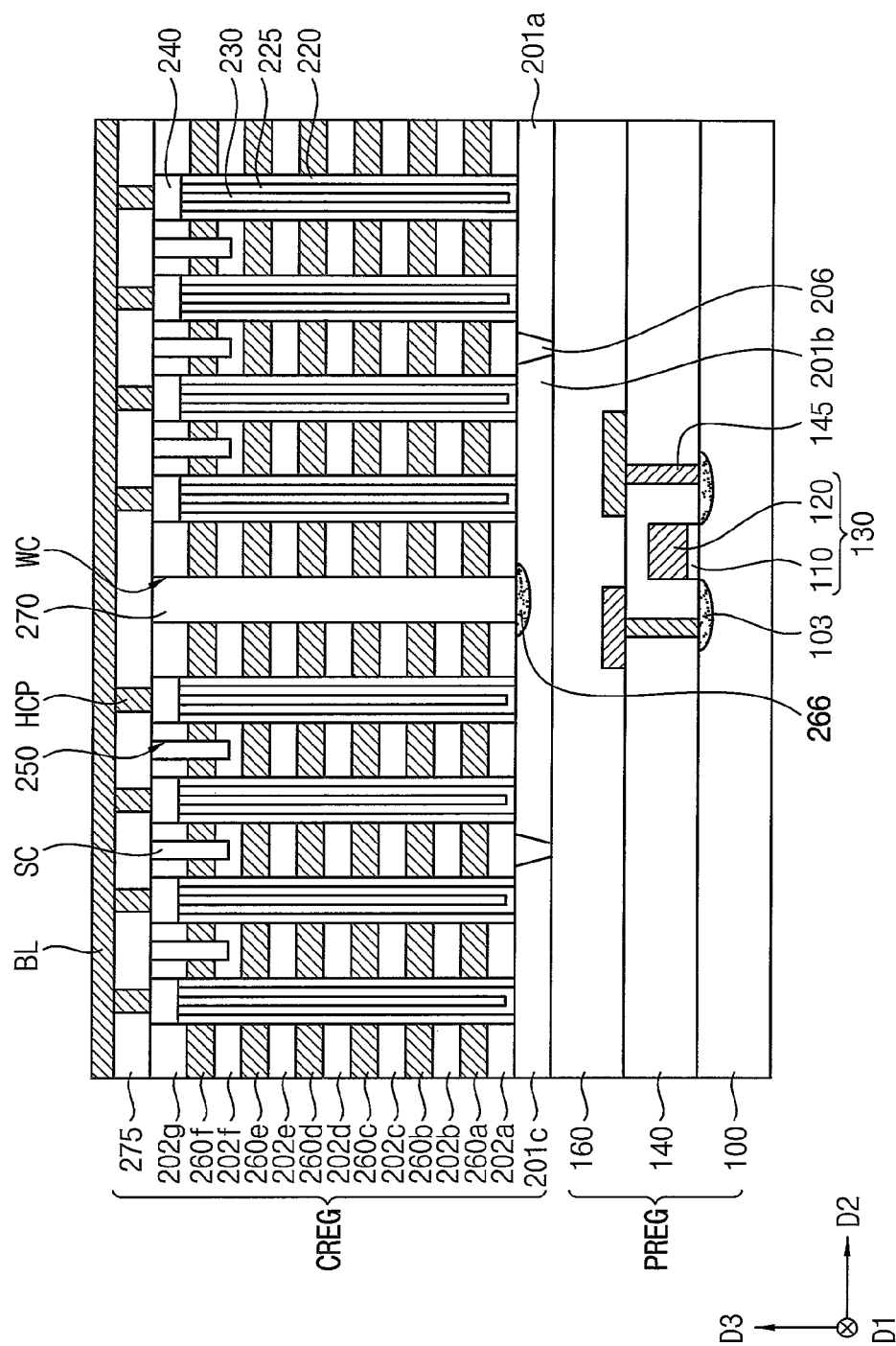

FIG. 7 is a plan view of a nonvolatile memory device according to example embodiments, and FIGS. 8 and 9 are cross-sectional views taken along lines I-I' and II-II' in FIG. 7, respectively.

The nonvolatile memory device illustrated in FIGS. 7 through 9 may have a cell over periphery (COP) structure in which a memory cell structure is stacked on a peripheral circuit. The memory cell structure may have a vertical NAND flash memory device structure in which a plurality of NAND flash memory cells is formed vertically, that is, in the vertical direction D3 perpendicular to a top surface of a substrate.

For clear and concise description, some elements of the memory device may not be shown in FIG. 7. For example, FIG. 7 illustrates base layer patterns 201a, 201b and 201c, separation layer patterns 206, a second impurity region 266, pads 240, a mold protection layer 212, a first connecting contact 248a and a second connecting contact 248b, and the other elements than described above are omitted.

Referring to FIGS. 7 through 9, the memory device may include a peripheral region PREG including a peripheral circuit structure and a cell region CREG including a memory cell structure.

The peripheral circuit structure may include, e.g., a transistor including a gate structure 130 and a source/drain region 103 formed on a substrate 100, lower insulation layers 140 and 160, a lower contact 145, and lower wirings 150.

The substrate 100 may include a semiconductor material, e.g., single crystalline silicon or a single crystalline germanium. The gate structure 130 may include a gate insulation layer pattern 110 and a gate electrode 120, which are stacked on the substrate 100. The transistor, which includes the gate structure 130 and the source/drain region 103, may be disposed and defined on the substrate 100.

The gate insulation layer pattern 110 may include, e.g., silicon oxide or a metal oxide. The gate electrode 120 may include, e.g., a metal, a metal nitride or doped polysilicon. The source/drain region 103 may include n-type or p-type impurities.

A first lower insulation layer 140 may be formed on the substrate 100 and cover the transistor, and the lower contact 145 may extend through the first lower insulation layer 140 to be electrically connected to the source/drain region 103.

The lower wirings 150 may be disposed on the first lower insulation layer 140 and may be electrically connected to the lower contact 145 and the through-substrate via 145 respectively. A second lower insulation layer 160 may be formed on the first lower insulation layer 140 and cover the lower wirings 150. FIG. 8 illustrates a non-limiting example that the lower wirings 150 are disposed in the same layer, but the lower wirings may be distributed in different wiring layers.

The first and second lower insulation layers 140 and 160 may include an insulating material, e.g., silicon oxide. The lower contact 145 and the lower wirings 150 may include a conductive material, e.g., a metal, a metal nitride or doped polysilicon.

The memory cell structure may include first to third base layer patterns 201a, 201b and 201c, a channel 225, the gate line 260, a bitline BL and a connecting wiring 296.

The separation layer pattern 206 may extend in the row direction D1, and a plurality of the separation layer patterns 206 may be arranged in the column direction D2. Thus, a base layer may be physically divided into the first to third base layer patterns 201a, 201b and 201c. FIGS. 7 through 9 illustrate three base layer patterns 201a, 201b and 201c, however, the number of the base layer patterns is not necessarily limited herein.

The base layer patterns 201a, 201b and 201c may include polysilicon or single crystalline silicon. In some embodiments, the base layer patterns 201a, 201b and 201c may further include p-type impurities such as boron (B). In this case, the base layer patterns 201a, 201b and 201c may serve as a p-type well.

The separation layer pattern 206 may extend linearly in the row direction D1. The base layer patterns 201a, 201b and 201c may be physically separated by the separation layer pattern 206. The separation layer pattern 206 may include an insulation layer pattern, e.g., a silicon oxide pattern.

The channel 225 may be disposed on the base layer patterns 201a, 201b and 201c, and may extend in vertical direction D3 from top surfaces of the base layer patterns 201a, 201b and 201c. The channel 225 may have a hollow cylindrical shape or a cup shape. The channel 225 may include polysilicon or single crystalline silicon, and may include an impurity region doped with, e.g., p-type impurities such as boron.

A plurality of the channels 225 may be arranged in the row direction D1 to form a channel row, and a plurality of the channel rows may be arranged in the column direction D2. In some example embodiments, the channels 225 included in the neighboring channel rows may be arranged in a zigzag arrangement. Thus, a number of the channels 225 in a unit area of the base layer pattern 201a, 201b and 201c may be increased, and accordingly, a channel density may increase.

A filling layer pattern 230 may be disposed in an inner space of the channel 225. The filling layer pattern 230 may have a pillar shape or a solid cylindrical shape. The filling layer pattern 230 may include an insulation layer pattern, e.g., silicon oxide.

According to an embodiment, the filling layer pattern 230 may be omitted, and the channel 225 may have a pillar shape or a solid cylindrical shape.

A dielectric layer structure 220 may be formed on an outer sidewall of the channel 225. The dielectric layer structure 220 may have a cup shape wherein a bottom portion is exposed, or a hollow cylindrical shape.

The dielectric layer structure 220 may include a tunnel insulation layer, a charge storage layer and a blocking layer which may be sequentially stacked from the outer sidewall of the channel 225. The blocking layer may include silicon oxide or a metal oxide such as hafnium oxide or aluminum oxide. The charge storage layer may include a nitride such as silicon nitride or a metal oxide, and the tunnel insulation layer may include an oxide such as silicon oxide. For example, the dielectric layer structure 220 may have an oxide-nitride-oxide (ONO) stack layer structure.

The pad 240 may be formed on the filling layer pattern 230, the channel 225 and the dielectric layer structure 220. For example, the filling layer pattern 230, the channel 225 and the dielectric layer structure 220 may be capped or at least partially covered by the pad 240. The pad 240 may include a polysilicon or single crystalline silicon. The pad 240 may further include n-type impurities, for example, phosphorus (P) or arsenic (As).

As illustrated in FIG. 7, a plurality of the pads 240 may be arranged in the row direction D1 to form a pad row pattern substantially similar to the channel row pattern. A plurality of the pad rows may be arranged in the column direction D2.

The gate lines 260 (e.g., 260a through 260f) may be disposed on an outer sidewall of the dielectric layer structure 220 and may be spaced apart from each other vertically in the third direction. In example embodiments, each gate line 260 may surround the channels 225 of at least one channel row and may extend in the second direction.

For example, as illustrated in FIGS. 7 through 9 each gate line 260 may surround six channel rows, however, the number of the channel rows surrounded by each gate line 260 is not necessarily limited.

The gate line 260 may include a metal having a low electrical resistance and/or a nitride thereof. For example, the gate line 260 may include tungsten (W), tungsten nitride, titanium (Ti), titanium nitride, tantalum (Ta), tantalum nitride, platinum (Pt), or the like. In some embodiments, the gate line 260 may have a multi-layered structure including a barrier layer formed of a metal nitride and a metal layer.

For example, a lowermost gate line 260a may serve as a ground selection line (GSL). Four gate lines 260b, 260c, 260d and 260e on the GSL may serve as wordlines. An uppermost gate line 260f on the wordlines may serve as a string selection line (SSL).

In this case, the GSL may be formed at a single level, the wordlines may be formed at four levels, and the SSL may be formed at a single level. However, each of the number of levels of the GSL, the wordline and the SSL is not necessarily limited. According to some embodiments, the GSL and the SSL may be formed at two levels, respectively, and the wordline may be formed at $2^n$ levels such as 4, 8 or 16 levels. The stacked number of the gate lines 260 may be determined variously in consideration of a circuit design and a degree of integration of the semiconductor device.

Insulating interlayers 202 (e.g., 202a to 202g) may be disposed between the gate lines 260 neighboring along the vertical direction D3. The insulating interlayers 202 may include a silicon oxide based material, e.g., silicon dioxide ($SiO_2$), silicon oxycarbide (SiOC) or silicon oxyfluoride (SiOF). The gate lines 260 may be insulated from each other along the vertical direction D3 by the insulating interlayers 202.

The wordline cut pattern 270 or the wordline cut region WC may be formed through the gate lines 260 and the insulating interlayers 202 along the vertical direction D3. The word line cut region WC may have a trench shape or a ditch shape extending in the row direction D1.

The wordline cut pattern 270 extending in the vertical direction D3 may be disposed on the second impurity region 266. A plurality of the second impurity regions 266 and the wordline cut patterns 270 may be arranged along column direction D2. In some embodiments, the second impurity region 266 may include n-type impurities, for example, phosphorus (P) or arsenic (As). The wordline cut pattern 270 may include an insulation layer pattern, e.g., silicon oxide. A metal silicide pattern such as a cobalt silicide pattern and/or a nickel silicide pattern may be further formed on the second impurity region 266.

In some example embodiments, a memory block sharing the gate lines 260 may be defined by the wordline cut pattern 270. The memory block may be divided into sub-memory blocks by the separation layer pattern 206. Thus, a size of an individual block may be reduced, and segmented operational control may be achieved.

In some embodiments, cine of the second impurity regions 266 and one of the wordline cut patterns 270 may be provided per each base layer pattern 201a, 201b and 201c. As illustrated in FIG. 9, for example, the second impurity region 266 may be formed at a central region of the second base layer pattern 201b, and the wordline cut pattern 270 may be disposed on the second impurity region 266.

A connecting contact or a vertical contact and a connecting wiring may be provided for each base layer pattern 201a, 201b and 201c to transfer an electrical signal and/or a voltage from a peripheral circuit.

In example embodiments, the mold protection layer 212 may be formed on lateral portions of the base layer pattern 201a, 201b and 201c, and the separation layer pattern 206. The first connecting contact 248a may extend through the mold protection layer 212 to make contact with a first impurity region 248 formed at the lateral portion of the base layer pattern 201a, 201b and 201c. The second contact 248b may extend through the mold protection layer 212, the base layer pattern 201a, 201b and 201c, and a second lower insulation layer 160 to make contact with a lower wiring 150. A first insulation layer pattern 241a and a second insulation layer pattern 241b may be formed on sidewalls of the first connecting contact 248a and the second connecting contact 248b, respectively.

A first plug 291 and a second plug 293 may extend through an upper insulation layer 275 to with the first connecting contact 248a and the second connecting contact 248b, respectively. The connecting wiring 296 may be disposed on the upper insulation layer to electrically connect the first and second plugs 291 and 293, respectively.

A string selection line cut pattern 250 may be disposed in the string selection line cut region SC. The string selection line cut pattern 250 may include an insulation material, e.g., silicon oxide.

In example embodiments, the string selection line cut region SC or the string selection line cut pattern 250 may provide a separation of the SSL in each memory block. In this case, the string selection line cut region SC or the string selection line cut pattern 250 may extend through an uppermost insulating interlayer 202g and the SSL 260f, and may extend partially through an insulating interlayer 202f directly under the SSL 260f.

An upper insulation layer 275 may be formed on the uppermost insulating interlayer 202g, the pad 240, the string selection line cut pattern 250, the wordline cut pattern 270, the first connecting contact 244a and the second connecting contact 244b.

Channel contact plugs HCP may be formed through the upper insulation layer 275 to make contact with the pad 240. The channel contact plugs HCP may define an arrangement comparable to an arrangement of the channels 225 or the pads 240.

The bitline BL may be disposed on the upper insulation layer 275 to be electrically connected to the channel contact plug HCP. For example, the bitline BL may extend in the first direction to be electrically connected to a plurality of the channel contact plugs HCP. The bitline BL and the separation layer pattern 205 may extend in substantially the same direction.

According to example embodiments described above, the base layer may be physically separated by the separation layer pattern 206. Thus, the first to third base layer patterns 201a, 201b and 201c may be capable of being operated independently or individually.

The memory block may be further segmented or divided by the separation layer pattern 206, and thus signal interference or disturbance due to the large size of memory block may be reduced. Thus, reliability of the semiconductor device may be increased.

Figure 10:
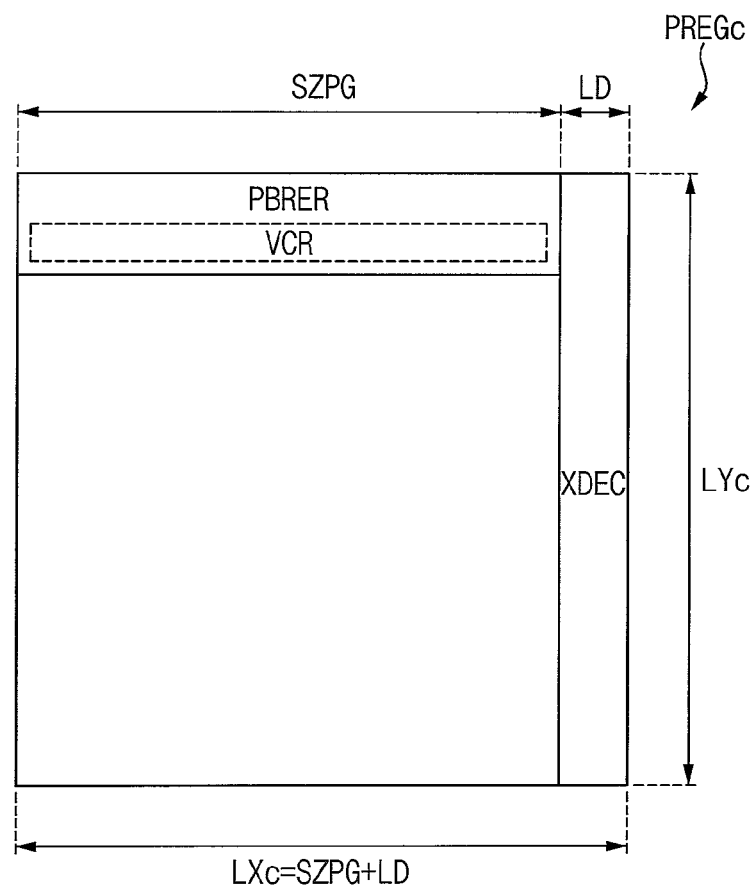
FIGS. 10 and 11 are plan views illustrating layouts of peripheral circuits including in a nonvolatile memory device having a cell over periphery (COP) structure.
Figure 10:
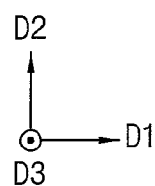
Figure 11:
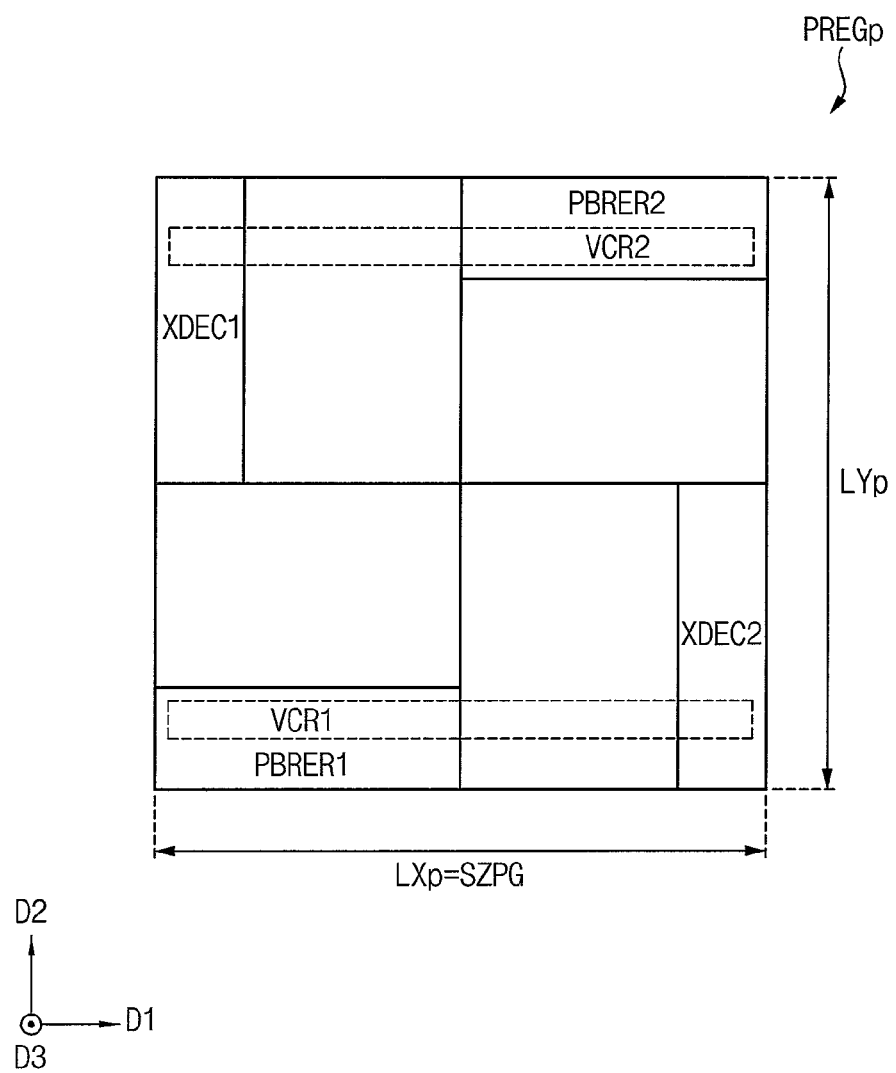

FIGS. 10 and 11 are plan views of layouts of peripheral circuits including in a nonvolatile memory device having a cell over periphery (COP) structure.

FIGS. 10 and 11 illustrate a layout of a peripheral region corresponding to one memory plane. A peripheral region PREGc of FIG. 10 corresponds to an upper structure in which a row decoder XDEC is not disposed under a memory cell array and a peripheral region PREGp of FIG. 11 corresponds to a buried structure in which a first row decoder XDEC1 and a second row decoder XDEC2 are disposed under a memory cell array.

As illustrated in FIG. 10, the peripheral region PREGc of the upper structure has a row-directional length LXc corresponding to a sum of a row-directional length SZPG of the memory cell array and a row-directional length LD of the row decoder XDEC. A vertical contact region VCR is disposed in the cell region CREG over a page buffer region PBRER. A column-directional length LYc of the peripheral region PREGc may be increased by a column-directional length of the vertical contact region VCR.

As illustrated in FIG. 11, in the peripheral region PREGp of the buried structure, a first page buffer region PBRER1 and a second page buffer region PBRER2 may be disposed at both end portions in the column direction D2, and a first, row decoder XDEC1 and a second row decoder XDEC2 may be disposed at both end portions in the row direction D1, to cover all of memory rows and memory columns in a memory cell array disposed over the peripheral region PREGp. The structure in FIG. 11 may be referred to as a windmill structure.

The row-directional length LXp of the peripheral region PREGp may be equal to the row-directional length SZPG of the memory cell array. The row-directional length LXp of the peripheral region PREGp may be reduced in comparison with the peripheral region PREGc of FIG. 10. The first vertical contact region VCR1 may be formed over the first page buffer region PBRER1 and the second vertical contact region VCR2 may be formed over the second page buffer region PBRER2. In this case, the column-directional length LYp of the peripheral region PREGp may be increased in comparison with the peripheral region PREGc of FIG. 10.

As described above, the half memory blocks may be disposed in the overhead regions in which the vertical contacts are not disposed, and thus memory capacity per unit area may be increased.

Figure 12:
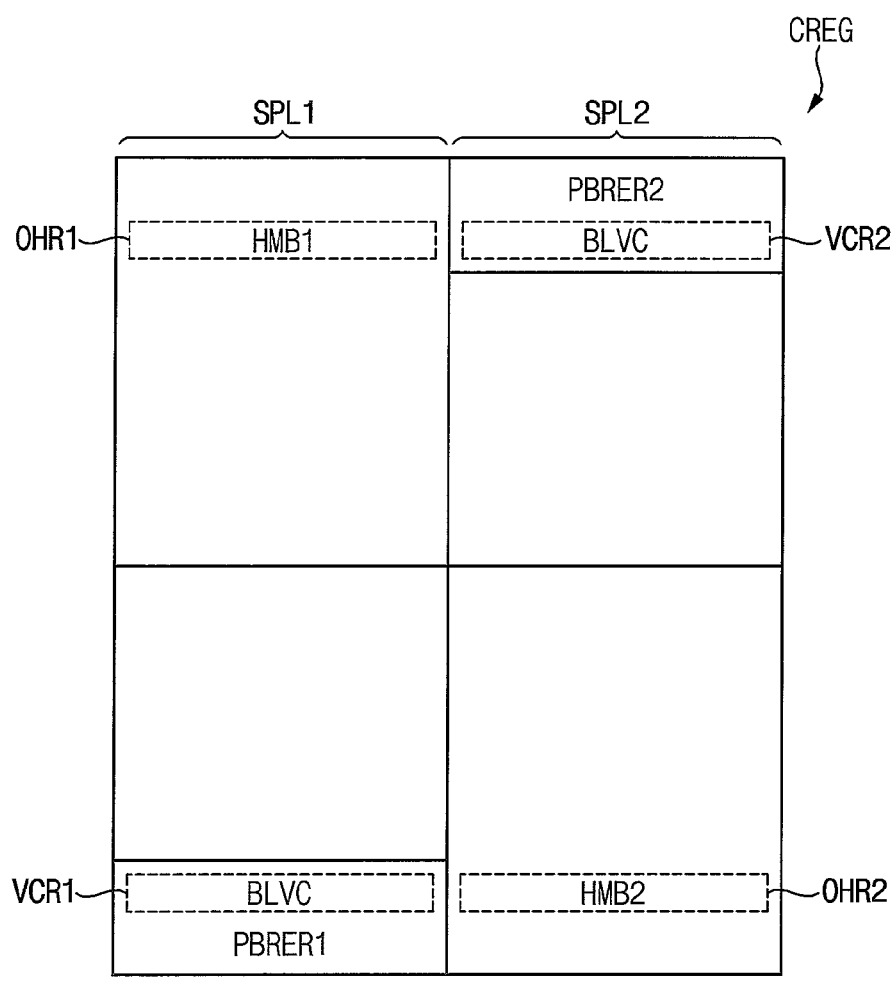
FIG. 12 is a plan view illustrating a layout of a cell region included in a nonvolatile memory device according to example embodiments.

FIG. 12 is a plan view of an example embodiment of a layout of a cell region included in a nonvolatile memory device according to example embodiments.

Referring to FIG. 12, a cell region CREG may be divided into a first sub memory plane SPL1 and a second sub memory plane SPL2. As described with reference to FIG. 11, a first page buffer region PBRER1 corresponding to the first sub memory plane SPL1 and a second page buffer region PBRER2 corresponding to the second sub memory plane SPL2 may be disposed at both end portions in the column direction D2.

A first vertical contact region VCR1 may be disposed in the cell region CREG over the first page buffer region PBRER1 and a second vertical contact region VCR2 may be disposed in the cell region CREG over the second page buffer region PBRER2. As described above, first half memory blocks HMB1 may be disposed in a first overhead region OHR1 that is adjacent to the second vertical contact region VCR2 in the row direction D1, and second half memory blocks HMB2 may be disposed in a second overhead region OHR2 that is adjacent to the first vertical contact region VCR1 in the row direction D1, Bitline vertical contacts BLVC may be disposed in the first vertical contact region VCR1 and the second vertical contact region VCR2. The bitline vertical contacts BLVC may connect the bitlines disposed at a top portion of the cell region CREG to the page buffers disposed in the first page buffer region PBRER1 and the second page buffer region PBRER2.

Figure 13:
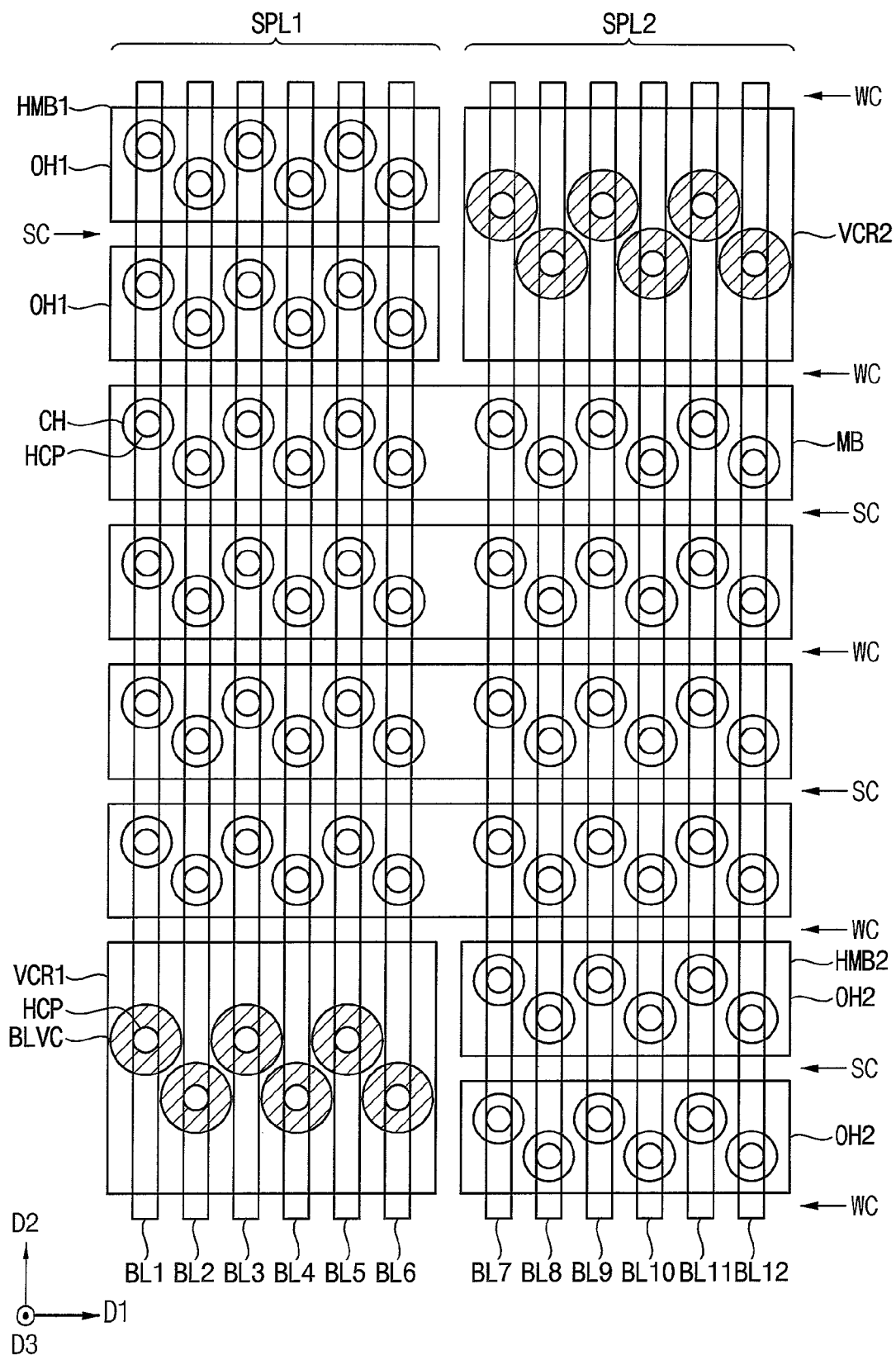
FIG. 13 is a plan view illustrating a layout of a cell region included in a nonvolatile memory device according to example embodiments.
Figure 14:
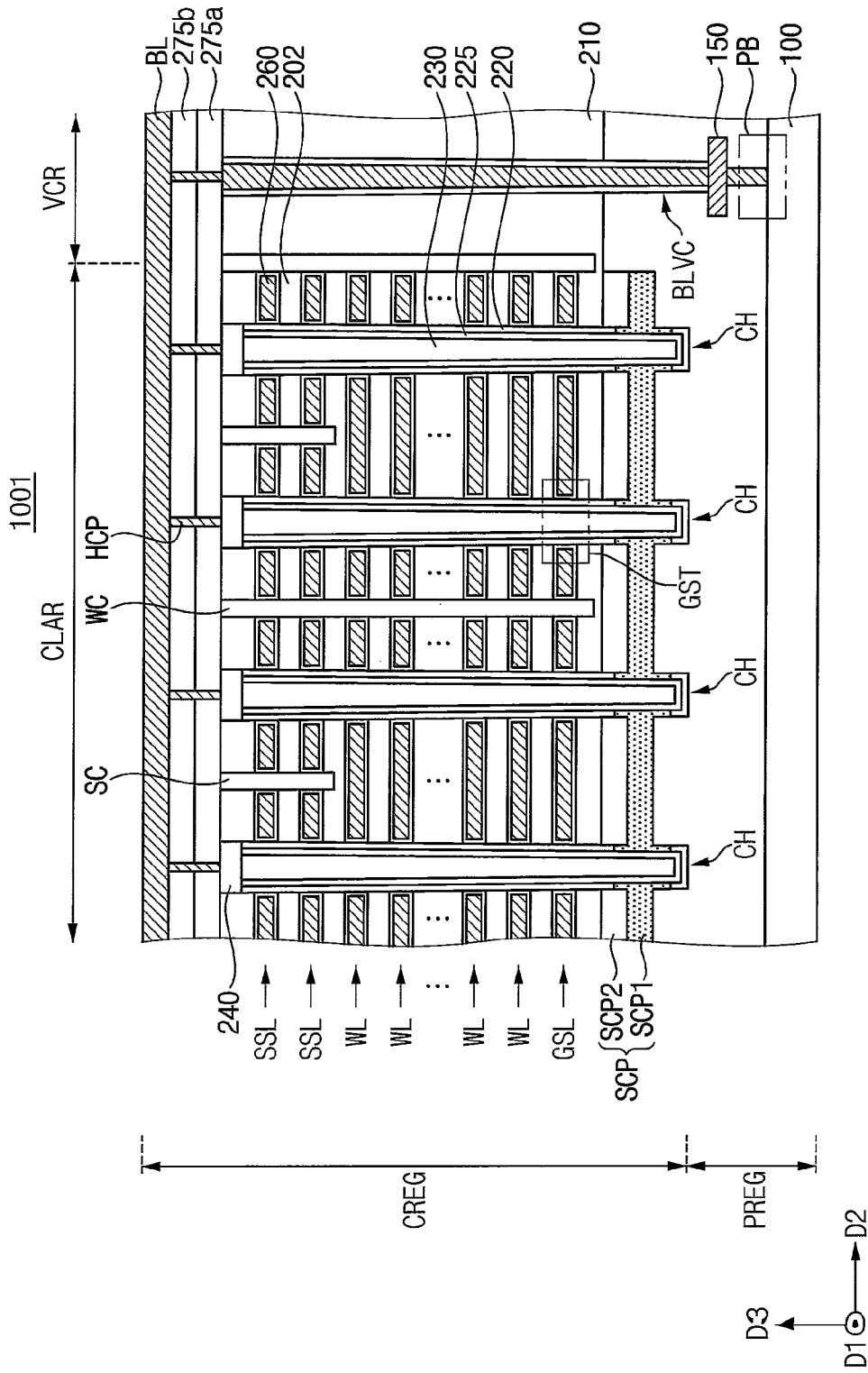
FIG. 14 is a cross-sectional diagram illustrating a vertical structure of a nonvolatile memory device having the layout of FIG. 13.
Figure 15:
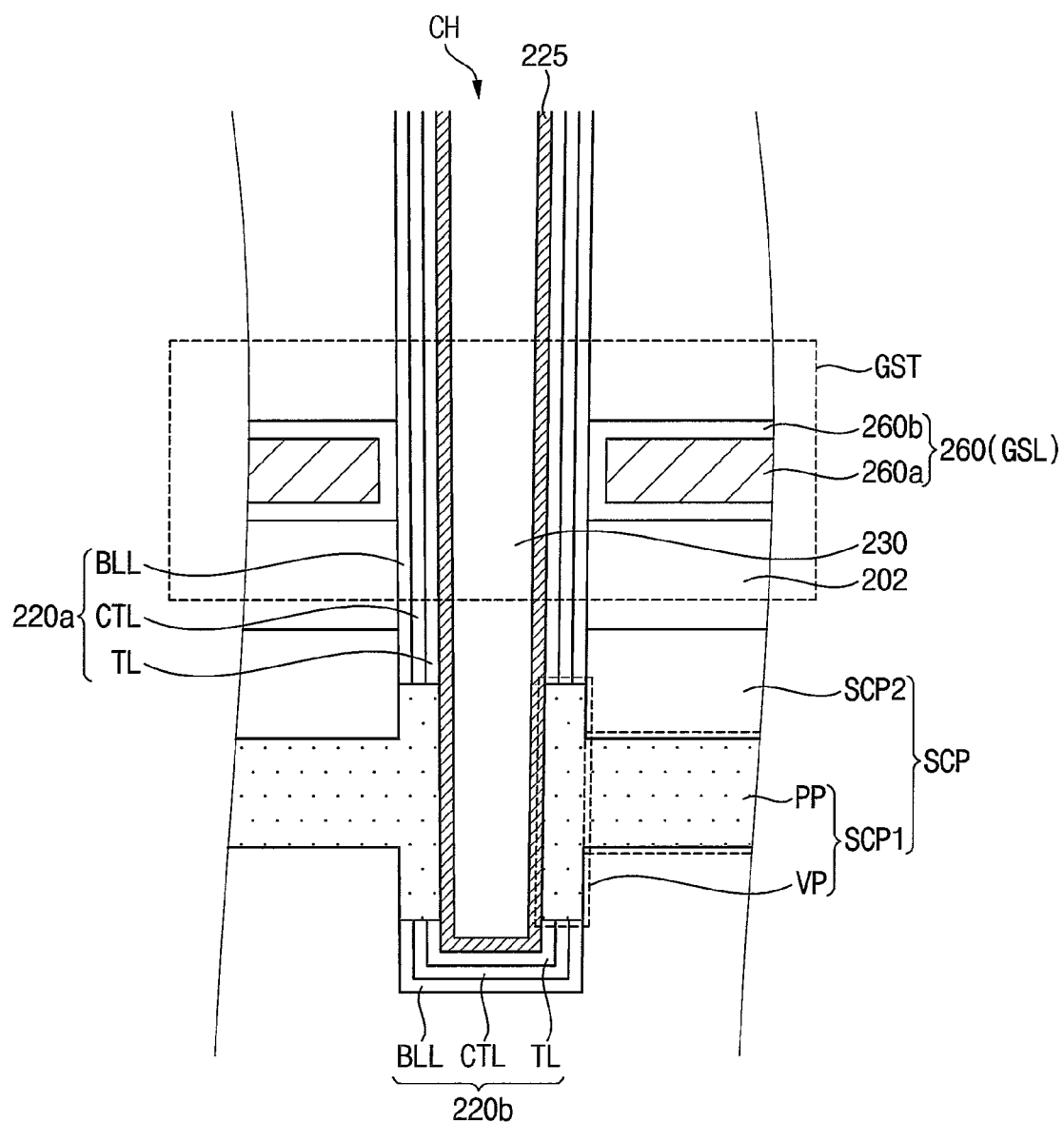
FIG. 15 is an enlarged sectional view of an end portion of a cell channel structure included in the nonvolatile memory device of FIG. 14.

FIG. 13 is a plan view of a layout of a cell region included in a nonvolatile memory device according to example embodiments, and FIG. 14 is a cross-sectional diagram of a vertical structure of a nonvolatile memory device having the layout of FIG. 13. FIG. 15 is an enlarged sectional view of an end portion of a cell channel structure included in the nonvolatile memory device of FIG. 14. Hereinafter, the extent that a description of an element has been omitted, it may be assumed that the element is at least similar to corresponding elements that have been described elsewhere in the instant specification.

Referring to FIGS. 13 through 15, a gate electrode structure including gate lines or gate electrodes SSL, WL and GSL may be disposed above a semiconductor substrate 100. The gate lines SSL, WL and GSL may be cut by the string selection line cut regions SC and/or the wordline cut regions WC as described above with reference to FIG. 9.

The gate electrode structure SSL, WL and GSL may include a buffer oxide layer 212, and gate electrodes 260 and insulating patterns 202, which are alternately and, repeatedly stacked on the buffer oxide layer 212. The gate electrodes 260 may include at least one ground selection gate electrode GSL, cell gate electrodes WL, and at least one string selection gate electrode SSL. The ground selection gate electrode GSL may be the lowermost electrode of the gate electrodes 260, and the string selection gate electrode SSL may be the uppermost electrode of the gate electrodes 260. The cell gate electrodes WL may be disposed between the ground selection gate electrode GSL and the string selection gate electrode SSL. The gate electrodes 260 may be formed of or may include at least one of, for example, doped silicon, metals (e.g., tungsten), metal nitrides, metal silicides, or any combination thereof.

Referring to FIG. 14, a nonvolatile memory device 1001 may be divided in the vertical direction D3 into the cell region CREG and the peripheral region PREG as described above, and may be divided in the second horizontal direction D2 into a cell string area CLAR and a contact area VCR. The contact area VCR corresponds to one of the first vertical contact region VCR1 and the second vertical contact region VCR2 in FIG. 13.

The cell channel structures CH may penetrate the gate electrode structure SSL, WL and GSL. Each cell channel structure CH may include a vertical channel portion 225 and a charge storing structure 220 surrounding the vertical channel portion 225. In addition, each cell channel structure CH may include an internal space, which is disposed in the vertical channel portion 225, and a gap-fill layer 230, which is surrounded by the internal space. Each cell channel structure CH may include a pad 240 provided in an upper portion thereof. The cell channel structures CH may be arranged in a zigzag shape or in a line shape, as seen in a plan view. The vertical channel portions 225 may be electrically connected to the substrate 100. The vertical channel portions 225 may include a single layer or multiple layers. The vertical channel portions 225 may include at least one of, for example, a single crystalline silicon layer, an organic semiconductor layer, or carbon nanostructures.

The charge storing structures 220 may extend along outer sidewalls of the vertical channel portions 225 and in the vertical direction D3. For example, the charge storing structures 220 may have a shape that surrounds the outer sidewalls of the vertical channel portions 225. The charge storing structures 220 may include at least one of, for example, a silicon oxide layer, a silicon nitride layer, a silicon oxynitride layer, and high-k dielectric layers and may have a single- or multi-layered structure.

FIG. 15 illustrates an end portion of the cell channel structure CH including the ground selection transistor GST. As shown in FIG. 15, each of the charge storing structures 220 may include a tunnel insulating layer TL, a blocking insulating layer BLL, and a charge storing layer CTL. The tunnel insulating layer TL may be disposed adjacent to each of the vertical channel portions 225 to enclose or at least partially cover the outer sidewall of the vertical channel portion 225. The blocking insulating layer BLL may be disposed adjacent to the gate electrodes 260. The charge storing layer CTL may be disposed between the tunnel insulating layer TL and the blocking insulating layer BLL. The tunnel insulating layer TL may include, for example, a silicon oxide layer or a high-k dielectric layer (e.g., aluminum oxide ($Al_2O_3$) or hafnium oxide ($HfO_2$)). The blocking insulating layer BLL may include, for example, a silicon oxide layer or a high-k dielectric layer (e.g., aluminum oxide ($Al_2O_3$) or hafnium oxide ($HfO_2$)). The charge storing layer CTL may include, for example, a silicon nitride layer. The gap-fill layers 230 may include, for example, a silicon oxide layer, a silicon nitride layer, or a silicon oxynitride layer.

The pad 240 may be disposed in the upper portion of each cell channel structure CH. The pad 240 may extend laterally to cover the top surface of the vertical channel portion 225 and a top surface of the charge storing structure 220. The pad 240 may at least partially cover or cap at least one of a top surface of the tunnel insulating layer TL, a top surface of the charge storing layer CTL, and a top surface of the blocking insulating layer BLL. For example, as shown in FIG. 14, the pad 240 may cover all of the top surfaces of the tunnel insulating layer TL, the charge storing layer CTL, and the blocking insulating layer BLL. The pad 240 may include a semiconductor material that is doped with impurities of the first conductivity type. As an example, the pad 240 may be a highly doped n-type region.

The vertical channel portion 225 and the pad 240 may be formed of a semiconductor material (e.g., silicon). As an example, the vertical channel portion 225 and the pad 240 may include poly silicon. The vertical channel portion 225 and the pad 240 may have different crystallographic structures from each other.

A first interlayered insulating layer 275a may be disposed on the gate electrode structure SSL, WL and GSL. The first interlayered insulating layer 275a may at least partially cover the top surface of the uppermost insulating pattern 202 and the top surfaces of the pads 240. The first interlayered insulating layer 275a may include, for example, a silicon oxide layer.

A second interlayered insulating layer 275b may be disposed on the first interlayered insulating layer 275a. The second interlayered insulating layer 275b may at least partially cover a top surface of the first interlayered insulating layer 275a. The second interlayered insulating layer 275b may include, for example, a silicon oxide layer.

The channel contact plugs HCP may be disposed on each cell channel structure CH. The channel contact plugs HCP may penetrate the second and first interlayered insulating layers 275a and 275b and may be in direct contact with the pads 240. The channel contact plugs HCP may include at least one of, for example, metal materials (e.g., copper or tungsten) and metal nitrides (e.g., TiN, TaN, or WIN).

The bitlines BL may be disposed on the second interlayered insulating layer 275b. The bitlines BL may extend in the column direction D2 in the cell string area CLAR and the contact area VCR. The bitlines BL may be spaced apart from each other in the row direction D1. Each bitline BL may be electrically connected to the cell channel structures CH arranged along the column direction D2. The bitlines BL may include, for example, a metal material.

The charge storing structure 220 may enclose the side surface of the vertical channel portion 225 and may be interposed between the bottom surface of the vertical channel portion 225 and the substrate 100. For example, the vertical channel portion 225 may be separated from the substrate 100.

A source conductive pattern SCP may be disposed between the substrate 100 and the buffer oxide layer 212. The source conductive pattern SCP may include a first source conductive pattern SCP1 and a second source conductive pattern SCP2. The second source conductive pattern SCP2 may be disposed on a top surface of the first source conductive pattern SCP1. The first source conductive pattern SCP1 may be extended from a region between the substrate 100 and the second source conductive pattern SCP2 to other regions, for example, between the second source conductive pattern SCP2 and the vertical channel portion 225, and between the substrate 100 and the vertical channel portion 225. As illustrated in FIG. 15 the charge storing structure 220 may be divided into an upper charge storing structure 220a, which is placed on the first source conductive pattern SCP1, and a lower charge storing structure 220b, which is placed below the first source conductive pattern SCP1.

In some example embodiments, the first source conductive pattern SCP1 may include a horizontal portion PP and a vertical portion VP. The horizontal portion PP of the first source conductive pattern SCP1 may be disposed between the substrate 100 and the second source conductive pattern SCP2. The vertical portion VP may be extended from a region between the vertical channel portion 225 and the horizontal portion PP to other regions, for example, between the second source conductive pattern SCP2 and the vertical channel portion 225, and between the substrate 100 and the vertical channel portion 225. The vertical portion VP may be in contact with the charge storing structure 220. A top surface of the vertical portion VP may be disposed at a vertical level between a top surface of the horizontal portion PP and a top surface of the second source conductive pattern SCP2. A bottom surface of the vertical portion VP may be disposed at a lower vertical level than the top surface of the substrate 100. The first and second source conductive patterns SCP1 and SCP2 may be formed of a polysilicon layer, which is doped with impurities of the first conductivity type, and a concentration of impurities doped into the second source conductive pattern SCP2 may be higher than that in the first source conductive pattern SCP1. The source conductive pattern SCP may be used as the above-described source line CSL.

In some example embodiments, the first vertical contact region VCR1 and the second vertical contact region VCR2 in FIG. 13 may include bitline vertical contacts BLVC. As illustrated in FIG. 14, each bitline vertical contacts BLVC may connect the bitline BL disposed in the top portion of the cell region CREG to each page buffer PB disposed in the first page buffer region PBRER1 and the second page buffer region PBRER2 in the peripheral region PREG.

Figure 16:
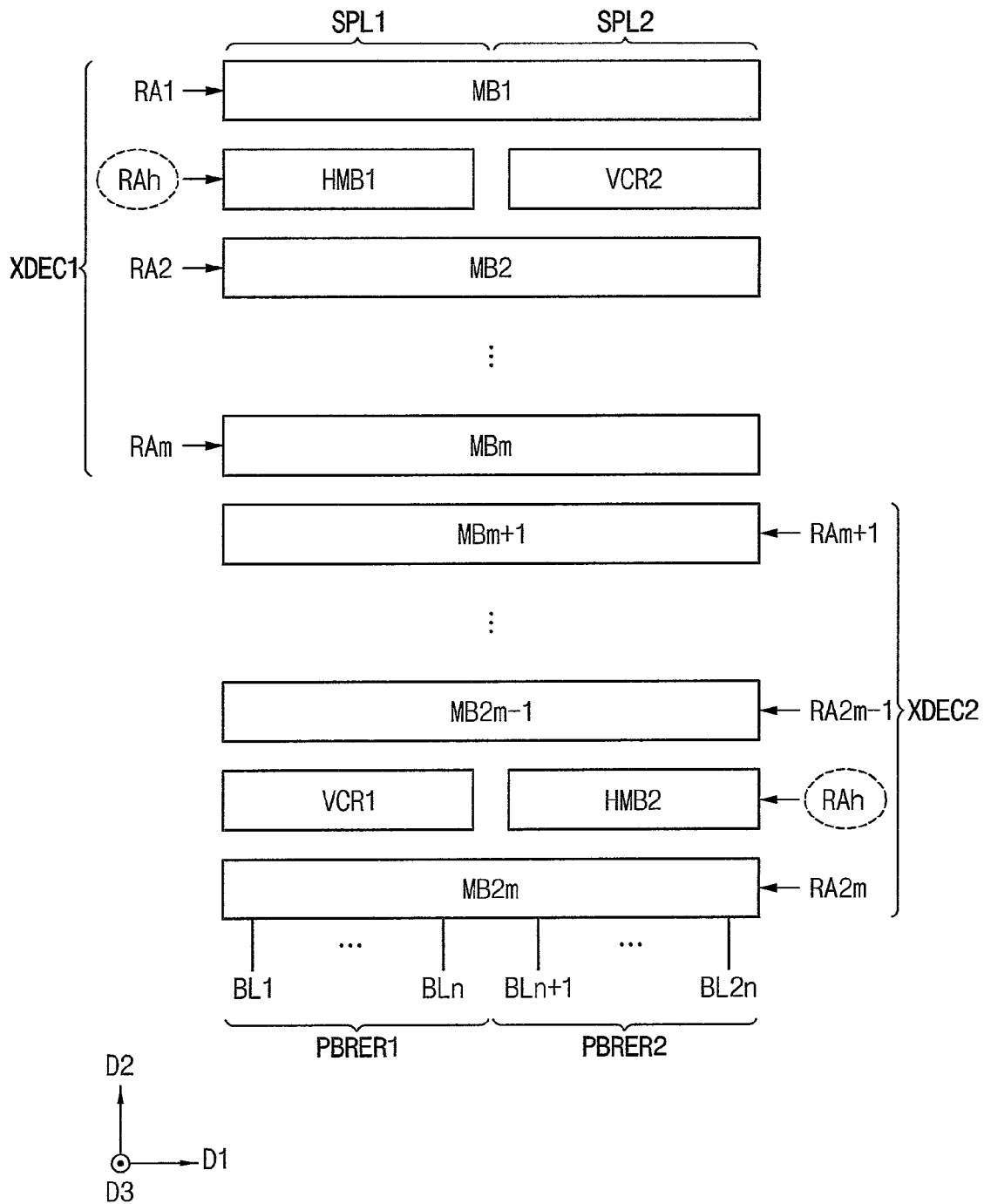
FIG. 16 is a diagram describing a method of operating a nonvolatile memory device according to example embodiments.

FIG. 16 is a diagram illustrating a method of operating a nonvolatile memory device according to example embodiments.

Referring to FIG. 16, a first row decoder XDEC1 may select one memory block corresponding to an access address from a memory controller among memory blocks MB1 through MBm having row addresses RA1 through RAm corresponding to one half of a memory plane, and the first row decoder XDEC1 may select one memory block corresponding to the access address among memory blocks MBm+1 through MB2m having row addresses RAm+1 through RA2m corresponding to the other half of the memory plane.

A first page buffer region PBRER1 may include page buffer connected to bitlines BL1 through BLn corresponding to a first sub memory plane SPL1, and a second page buffer region PBRER2 may include page buffer connected to bitlines BLn+1 through BL2n corresponding to a second sub memory plane SPL2.

An address mapping may be implemented such that the row address RAh of the first half memory block HMB1 is equal to the row address RAh of the second half memory block HMB2. The address mapping may be implemented through physical mapping and/or logical mapping. For example, the physical mapping may include changing configuration of an address decoder, and the logical mapping may include changing a flash translation layer (FTL) to convert the logical address from the memory controller to the physical address of the nonvolatile memory device.

When the access address corresponds to the row address RAh, the first row decoder XDEC1 may select one wordline in the first half memory block HMB1 and simultaneously select one wordline in the second half memory block HMB2.

As such, one of the first half memory blocks HMB1 in the first overhead region OHR1 and one of the second half memory blocks HMB2 in the second overhead region OHR2 may be selected simultaneously based on the same row address.

Figure 17:
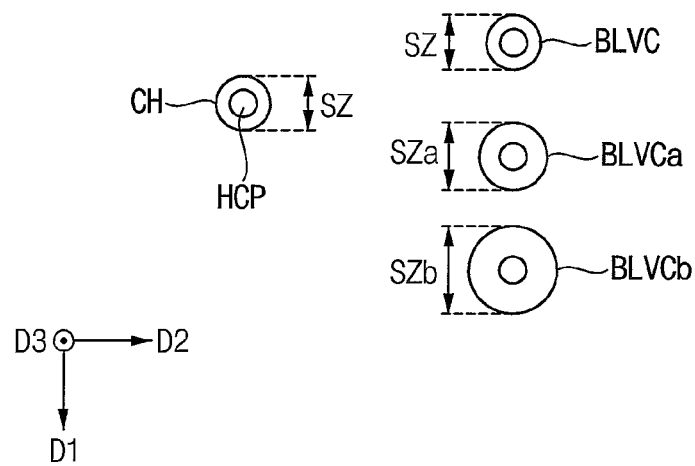
FIG. 17 is a diagram describing a size of a bitline vertical contact included in a nonvolatile memory device according to example embodiments.

FIG. 17 is a diagram that describes a size of a bitline vertical contact included in a nonvolatile memory device according to example embodiments.

Referring to FIG. 17, a size of horizontal cross-section (for example, a horizontal cross-sectional area) of the bitline vertical contact BLVC may be formed according to the operating modes and/or characteristics of the nonvolatile memory device.

In some example embodiments the size SZ of the horizontal cross-section of the cell channel structure CH in the cell string area CLAR may be equal to the size SZ of the horizontal cross-section of the bitline vertical contact BLVC in the contact area VCR. In the same or other example embodiments, the size SZ of the horizontal cross-section of the cell channel structure CH in the cell string area CLAR may be may be different from the size SZ of the horizontal cross-section of the bitline vertical contact BLVC in the contact area VCR. As illustrated in FIG. 17, the bitline vertical contacts BLVC, BLVCa and BLVCb having the various sizes SZ, SZa and SZb may be implemented according to various embodiments.

The resistance between the page buffer and the bitline may decrease as the size of the cross-section of the bitline vertical contact increases. Accordingly, the current flowing between the page buffer and the bitline may be adjusted by the horizontal cross-sectional area of the bitline vertical contact.

Figure 18:
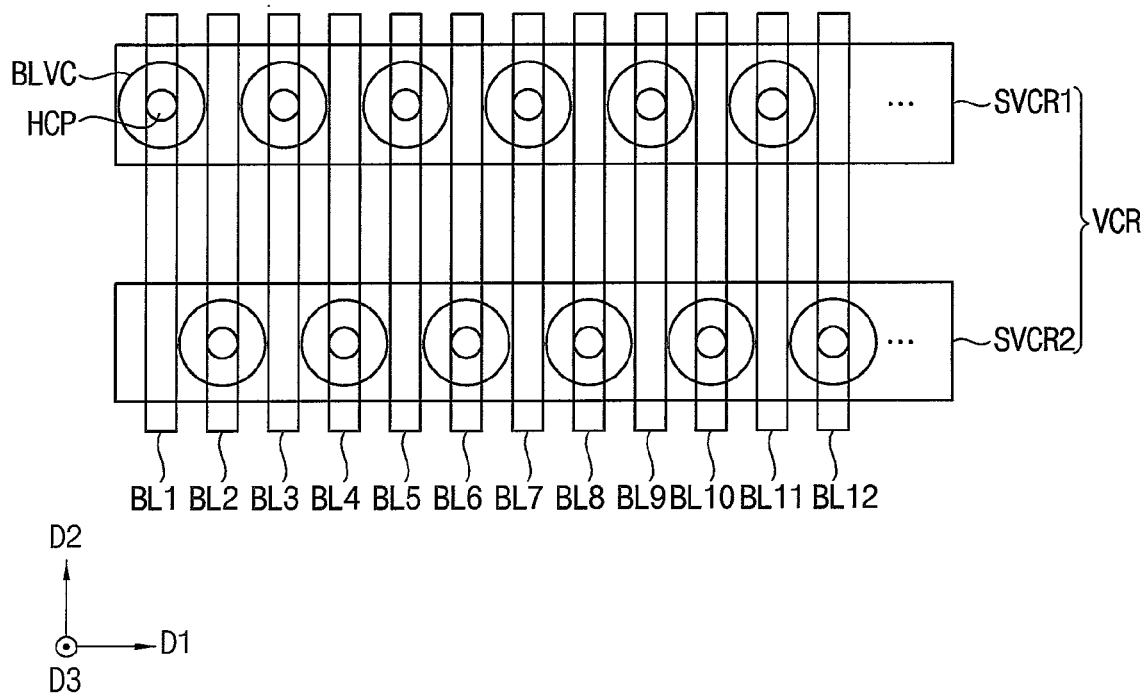
FIGS. 18 and 19 are diagrams illustrating a vertical contact region included in a nonvolatile memory device according to example embodiments.
Figure 19:
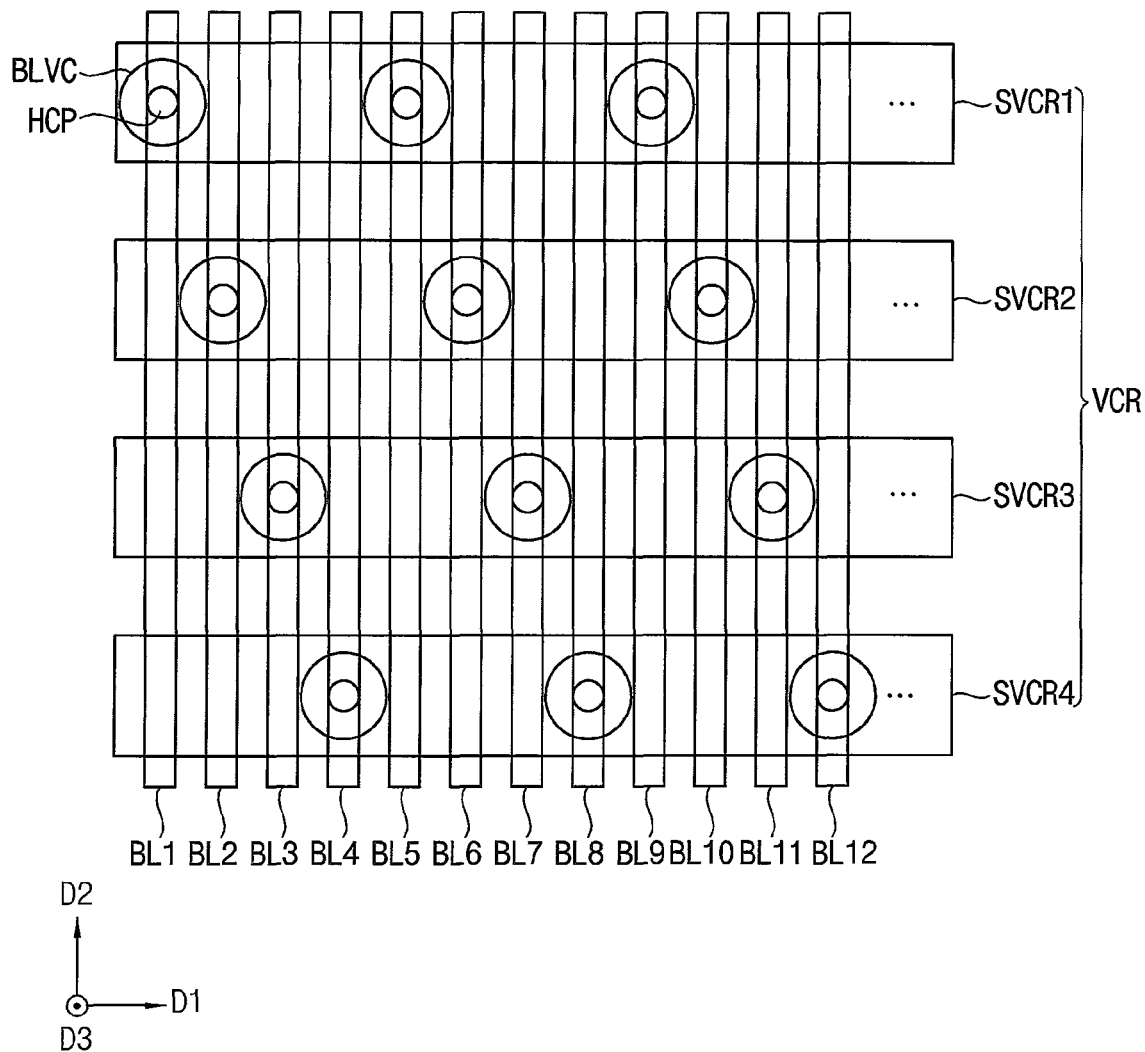

FIGS. 18 and 19 are diagrams of a vertical contact region included in a nonvolatile memory device according to example embodiments.

Referring to FIGS. 18 and 19, a contact region VCR may include q sub vertical contact regions where q is a natural number greater than one. The contact region VCR corresponds the first vertical contact region VCR1 and the second vertical contact region VCR2 as described above. In this case, q bitlines adjacent in the row direction D1 among the bitlines may each be sequentially connected to q bitline vertical contacts respectively included in the q sub vertical contact regions.

In some example embodiments, as illustrated in FIG. 18, the contact region VCR may include two sub vertical contact regions SVCR1 and SVCR2 arranged in the column direction D2. In this case, two bitlines adjacent in the row direction D1 may each be sequentially connected to the two bitline vertical contacts BLVC respectively included in the two sub vertical contact regions SVCR1 and SVCR2. As a result, the odd-numbered bitlines BL1, BL3, BL5, BL7, BL9 and BL11 may be connected to the first sub vertical contact regions SVCR1 and the even-numbered bitlines BL2, BL4, BL6, BL8, BL10 and BL12 may be connected to the second sub vertical contact regions SVCR2.

In some example embodiments, as illustrated in FIG. 19, the contact region VCR may include four sub vertical contact regions SVCR1 through SVCR4 arranged in the column direction D2. In this case, four bitlines adjacent in the row direction D1 may each be sequentially connected to the four bitline vertical contacts BLVC respectively included in the four sub vertical contact regions SVCR1 through SVCR4. For example, the four bitlines BL1, BL5 and BL9 may be connected to the first sub vertical regions.

Figure 20:
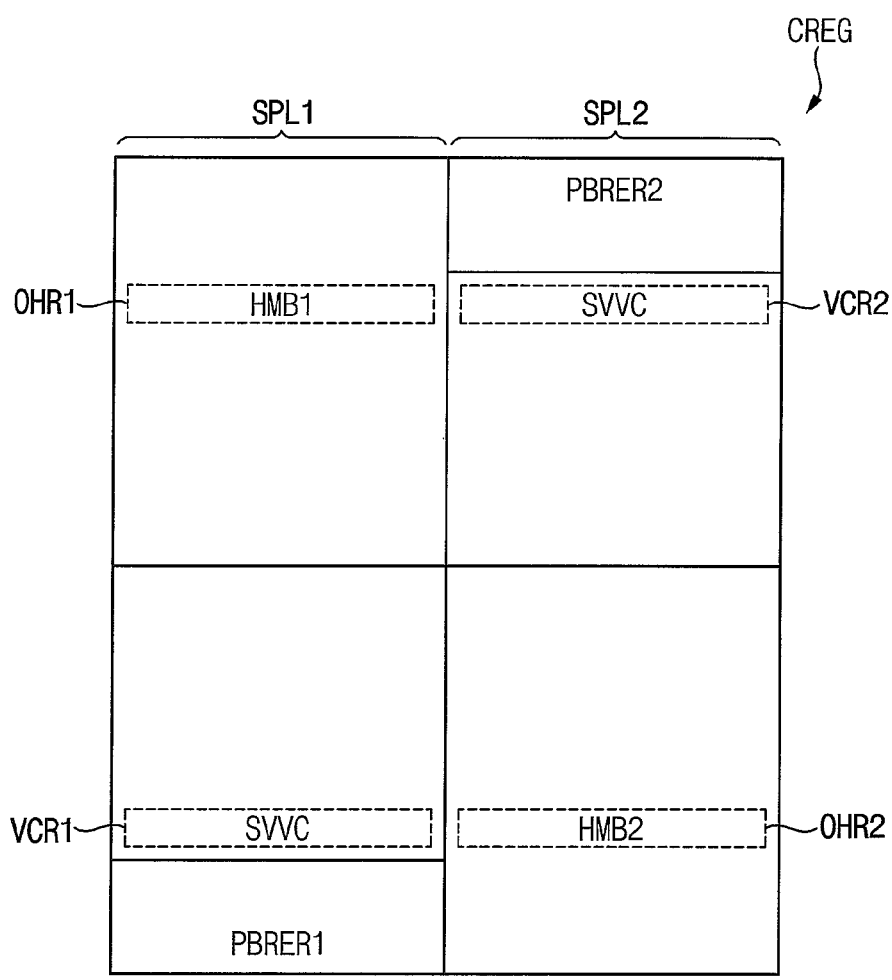
FIG. 20 is a plan view illustrating a layout of a cell region included in a nonvolatile memory device according to example embodiments.
Figure 20:
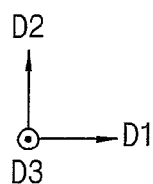

FIG. 20 is a plan view of a layout of a peripheral region included in a nonvolatile memory device according to example embodiments. The above description of like components may apply to the embodiment shown in FIG. 20.

Referring to FIG. 20, a cell region CREG may be divided into a first sub memory plane SPL1 and a second sub memory plane SPL2. As described with reference to FIG. 11, a first page buffer region PBRER1 corresponding to the first sub memory plane SPL1 and a second page buffer region PBRER2 corresponding to the second sub memory plane SPL2 may be disposed at both end portions in the column direction D2.

A first vertical contact region VCR1 may be disposed in the cell region CREG over the first page buffer region PBRER1 and a second vertical contact region VCR2 may be disposed in the cell region CREG over the second page buffer region PBRER2. As described above, first half memory blocks HMB1 may be disposed in a first overhead region OHR1 that is adjacent to the second vertical contact region VCR2 in the row direction D1, and second half memory blocks HMB2 may be disposed in a second overhead region OHR2 that is adjacent to the first vertical contact region VCR1 in the row direction D1, Source line vertical contacts SVVC may be disposed in the first vertical contact region VCR1 and the second vertical contact region VCR2. The source line vertical contacts SVVC may be connected to a source line disposed in a top portion or a bottom portion of the cell region CREG to provide a source voltage to the source line.

Figure 21:
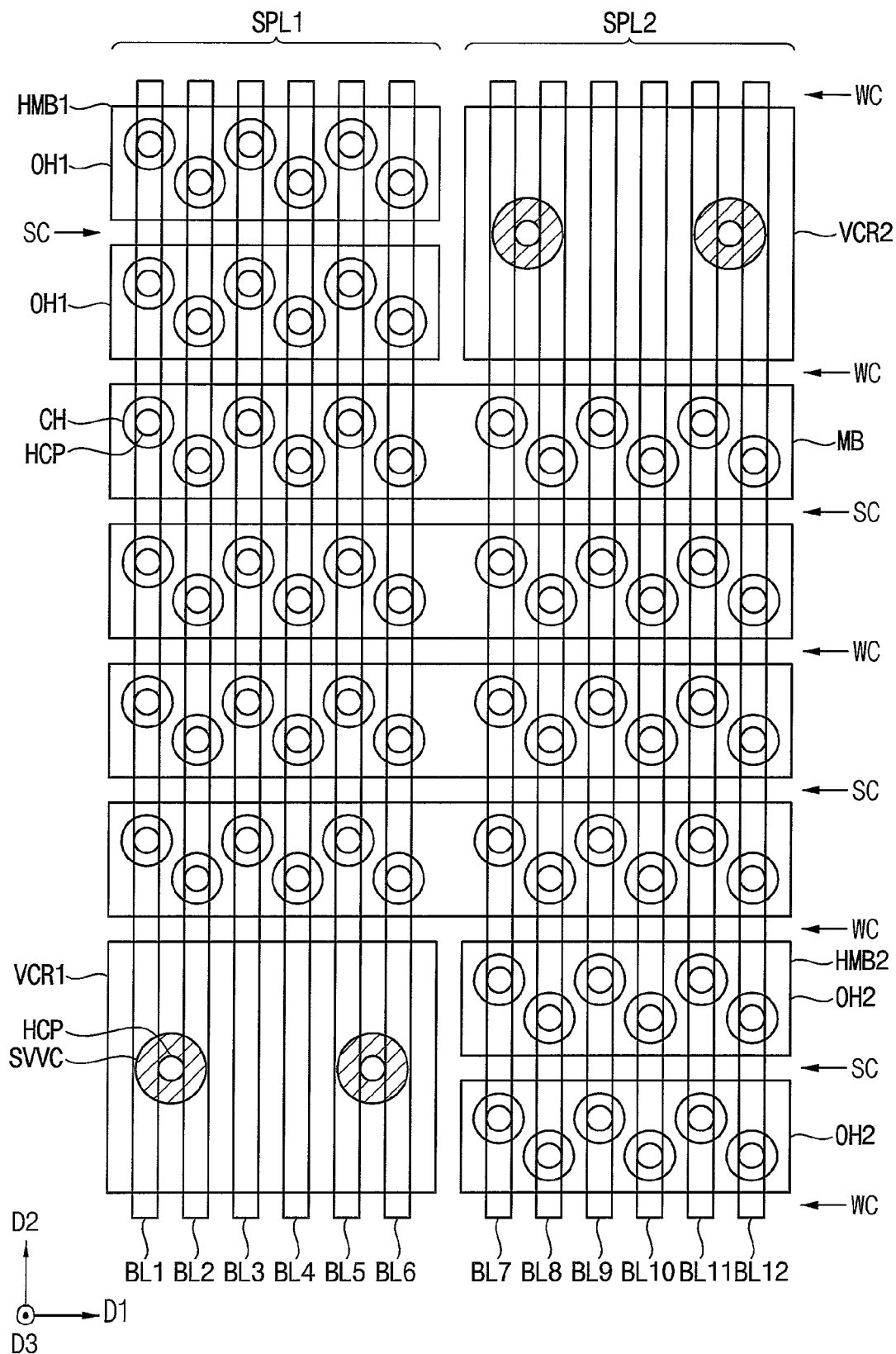
FIG. 21 is a plan view illustrating a layout of a cell region included in a nonvolatile memory device according to example embodiments.
Figure 22:
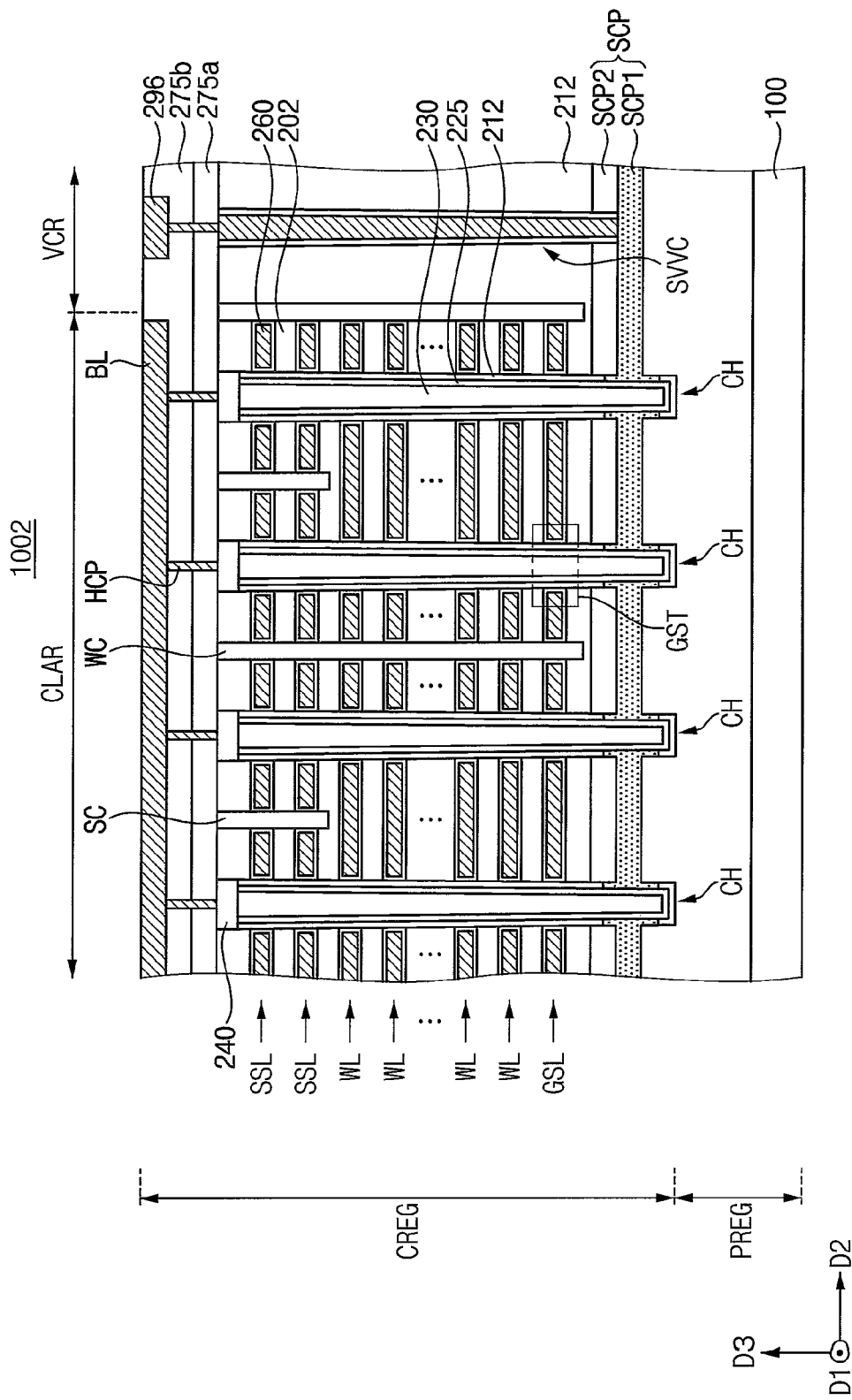
FIG. 22 is a cross-sectional diagram illustrating a vertical structure of a nonvolatile memory device having the layout of FIG. 21.

FIG. 21 is a plan view of a layout of a cell region included in a nonvolatile memory device according to example embodiments, and FIG. 22 is a cross-sectional diagram of a vertical structure of a nonvolatile memory device having the layout of FIG. 21. The layout and the vertical structure of FIGS. 21 and 22 are substantially the same as FIGS. 13 and 14 except the first vertical contact region VCR1 and the second vertical contact region VCR2, and accordingly repeated description of like components is omitted.

In some example embodiments, the first vertical contact region VCR1 and the second vertical contact region VCR2 in FIG. 21 may include source line vertical contacts SVVC. As illustrated in FIG. 22, each source line vertical contact SVVC may be connected between the connecting wiring 296 and the source line, e.g., the source conductive pattern SCP. The source voltage applied to the connecting wiring 296 may be provided to the source line through the source line vertical contact SVVC.

Figure 23:
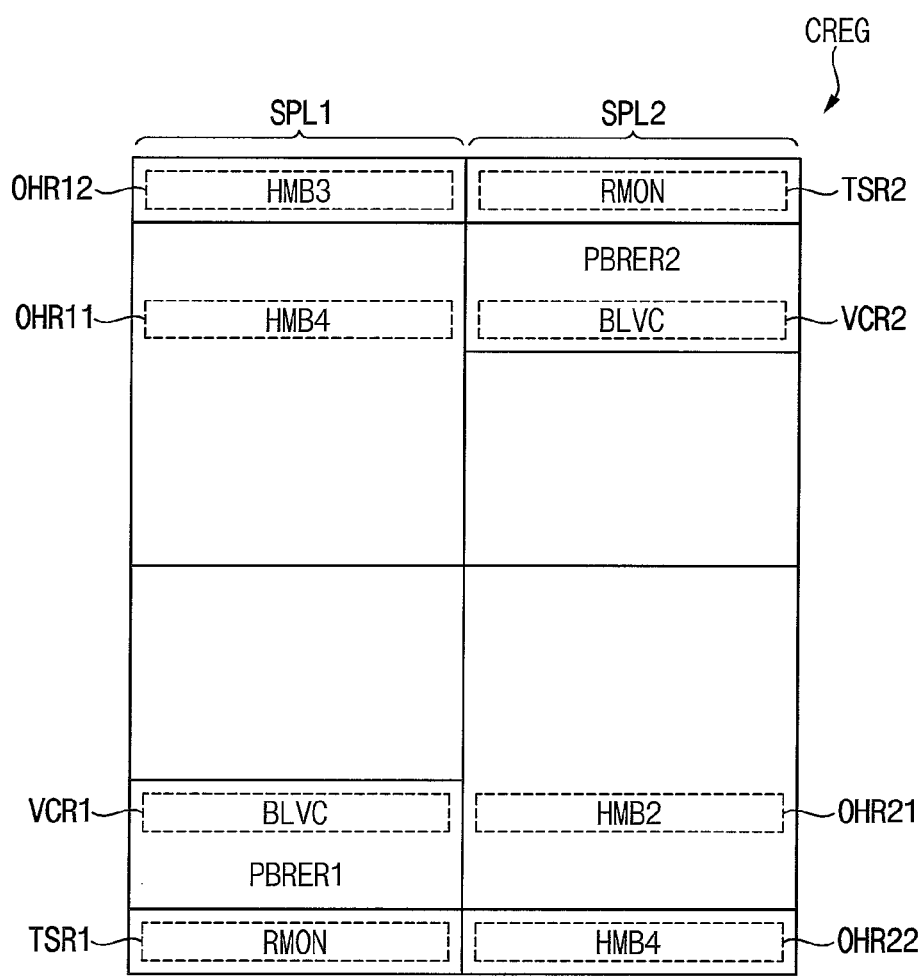
FIG. 23 is a plan view illustrating a layout of a cell region included in a nonvolatile memory device according to example embodiments.
Figure 23:
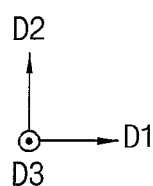

FIG. 23 is a plan view of a layout of a cell region included in a nonvolatile memory device according to example embodiments.

Referring to FIG. 23, a cell region CREG may be divided into a first sub memory plane SPL1 and a second sub memory plane SPL2. As described with reference to FIG. 11, a first page buffer region PBRER1 corresponding to the first sub memory plane SPL1 and a second page buffer region PBRER2 corresponding to the second sub memory plane SPL2 may be disposed at both end portions in the column direction D2.

A first vertical contact region VCR1 may be disposed in the cell region CREG over the first page buffer region PBRER1 and a second vertical contact region VCR2 may be disposed in the cell region CREG over the second page buffer region PBRER2. As described above, first half memory blocks HMB1 may be disposed in a first overhead region OHR1 that is adjacent to the second vertical contact region VCR2 in the row direction D1, and second half memory blocks HMB2 may be disposed in a second overhead region OHR21 that is adjacent to the first vertical contact region VCR1 in the row direction D1, Bitline vertical contacts BLVC may be disposed in the first vertical contact region VCR1 and the second vertical contact region VCR2. The bitline vertical contacts BLVC may connect the bitlines disposed at a top portion of the cell region CREG to the page buffers.

As illustrated in FIG. 23, the cell region CREG may further include a first test region TSR1, a second test region TSR2, a third overhead region OHR12 and a fourth overhead region OHR22.

The first test region TSR1 may be disposed in the cell region CREG of the first sub memory plane SPL1 and disposed near the first end portion in the column direction D2 of the cell region CREG. The second test region TSR2 may be disposed in the cell region CREG of the second sub memory plane SPL2 and disposed near the second end portion in the column direction D2 of the cell region CREG. The first end portion and the second portion may be on opposite sides of each other in the column direction D2.

The third overhead region OHR12 may be disposed in the cell region CREG of the first sub memory plane SPL1 and adjacent to the second test region TSR2 in the row direction D1. The fourth overhead region OHR22 may be disposed in the cell region CREG of the second sub memory plane SPL2 and adjacent to the first test region TSR1 in the row direction D1.

Test blocks may be disposed in the first test region TSR1 and the second test region TSR2, and may be configured to test operational characteristics of the nonvolatile memory device. In the same way as the first overhead region OHR1 and the second overhead region OHR2, third half memory blocks HMB3 may be disposed in the third overhead region OHR12 adjacent to the second test region 2 in the row direction D1, and fourth half memory blocks HMB4 may be disposed in the fourth overhead region OHR22 adjacent to the first test region 1 in the row direction D1.

Each of the first through fourth overhead regions OHR11, OHR21, OHR12 and OHR22 may include one or more half memory blocks corresponding to a half of a page, wherein a page is a unit of a read operation and a write operation.

Figure 24:
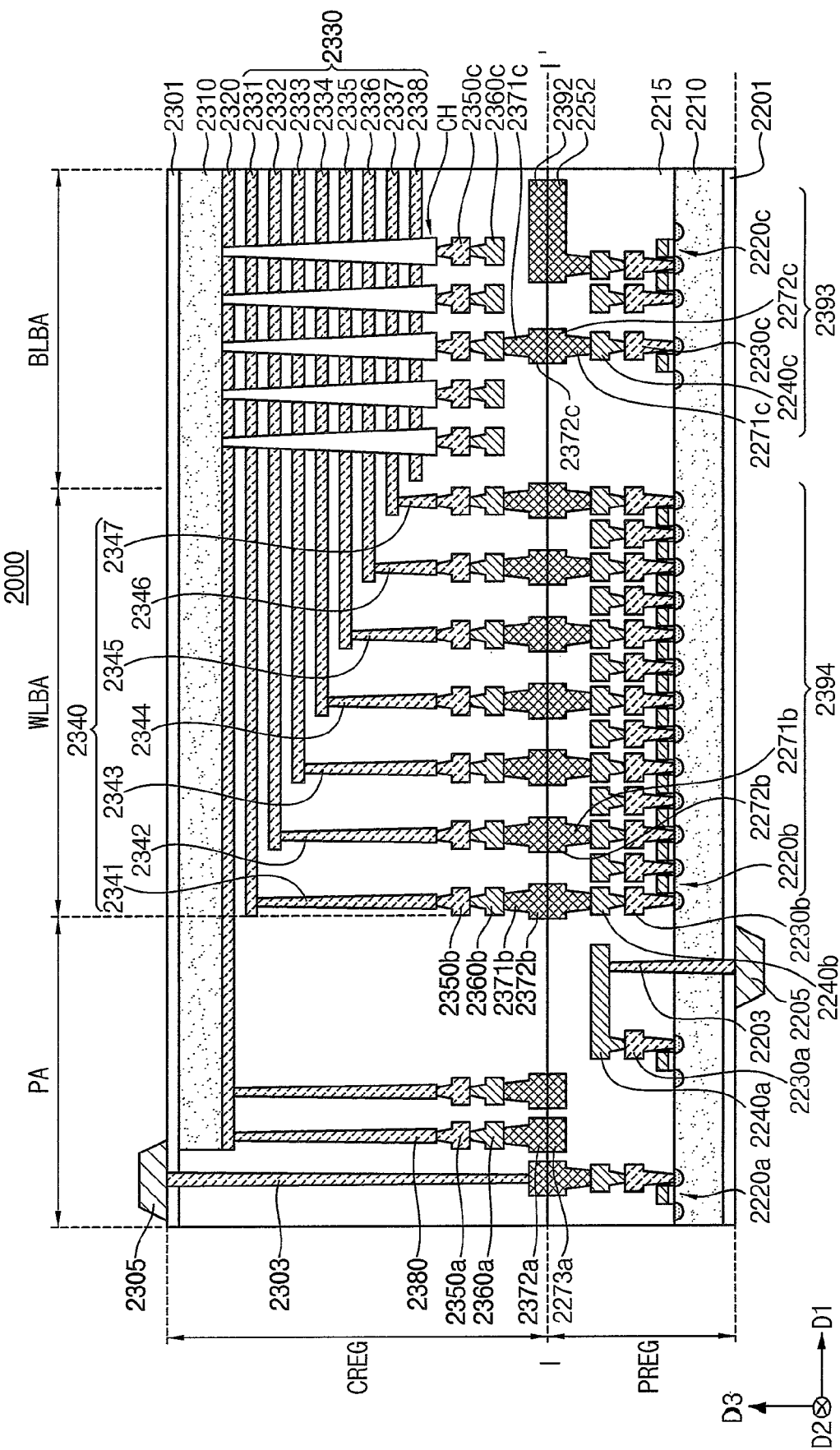
FIGS. 24 and 25 are cross-sectional diagrams illustrating a nonvolatile memory device according to example embodiments.
Figure 25:
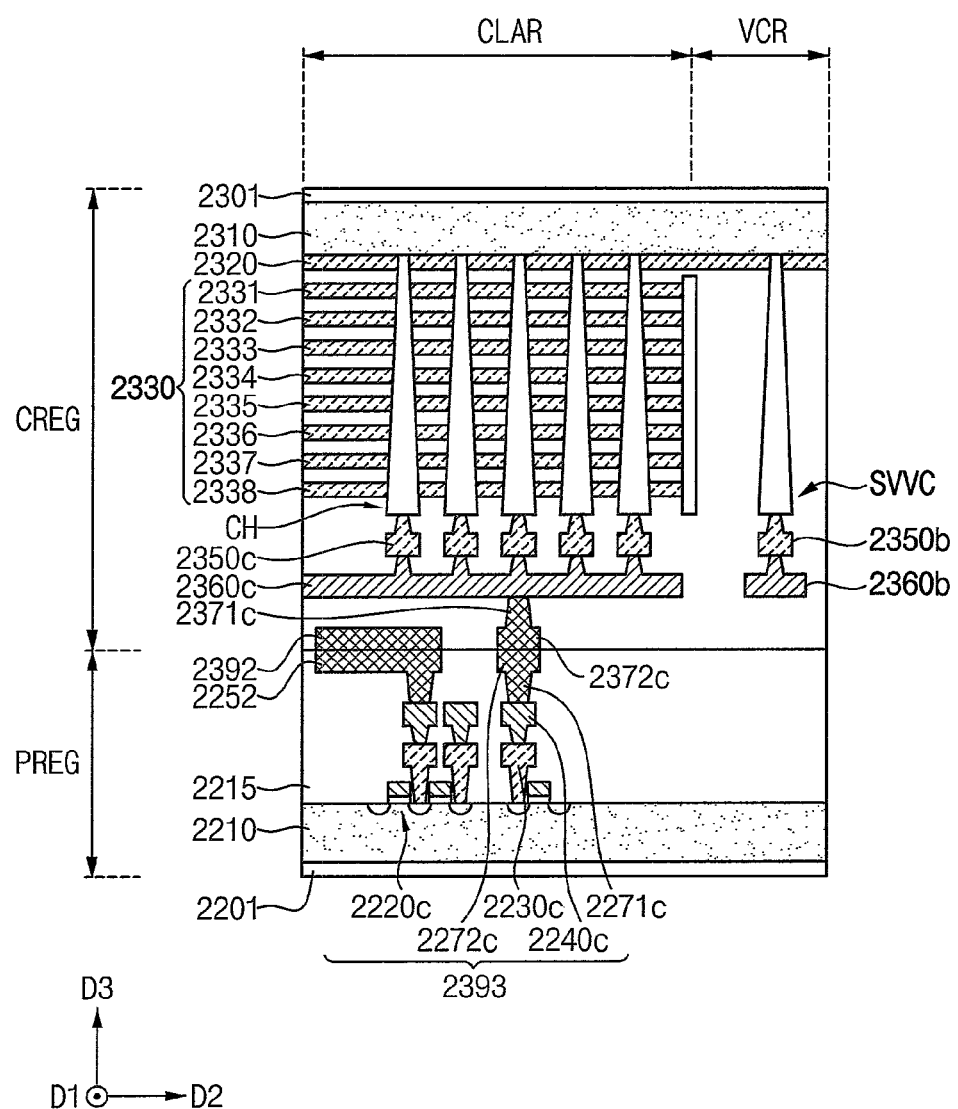

FIGS. 24 and 25 are cross-sectional diagrams of a nonvolatile memory device according to example embodiments.

Referring to FIG. 24, a nonvolatile memory device or a memory device 2000 may have a chip-to-chip (C2C) structure. Here, the term "C2C structure" denotes a structure in which an upper chip includes a memory cell region (e.g., the cell region CREG) on a first wafer, and a lower chip includes a peripheral circuit region (e.g., the peripheral region PREG) on a second wafer, wherein the upper chip and the lower chip are bonded (or mounted) together at a bonding surface I-I'. The bonding process may include a method of electrically connecting a bonding metal formed on an uppermost metal layer of the upper chip and a bonding metal formed on an uppermost metal layer of the lower chip. For example, after developing both chips, one of the chips may be inverted and electrically connected to the other chip. For example, when the bonding metals may include copper (Cu) using a Cu-to-Cu bonding. The example embodiment, however, is not necessarily limited thereto. For example, the bonding metals may also be formed of aluminum (Al) or tungsten (W).

Each of the peripheral region PREG and the cell region CREG of the memory device 2000 may include an external pad bonding area PA, a wordline bonding area WLBA, and a bitline bonding area BLBA.

For example, the peripheral region PREG may include a first substrate 2210, an interlayer insulating layer 2215, circuit elements 2220a, 2220b, and 2220c formed on the first substrate 2210, first metal layers 2230a, 2230b, and 2230c respectively connected to the circuit elements 2220a, 2220b, and 2220c, and second metal layers 2240a, 2240b, and 2240c formed on the first metal layers 2230a, 2230b, and 2230c. In some embodiments, the first metal layers 2230a, 2230b, and 2230c may be include tungsten having relatively high electrical resistivity, and the second metal layers 2240a, 2240b, and 2240c may include copper having relatively low electrical resistivity.

In some embodiments like the one illustrated in FIG. 24, although the first metal layers 2230a, 2230b, and 2230c and the second metal layers 2240a, 2240b, and 2240c are shown and described, the example embodiment is not necessarily limited thereto, and one or more additional metal layers may be further formed on the second metal layers 2240a, 2240b, and 2240c. At least a portion of the one or more additional metal layers formed on the second metal layers 2240a, 2240b, and 2240c may include aluminum or the like having a lower electrical resistivity than those of copper forming the second metal layers 2240a, 2240b, and 2240c.

The interlayer insulating layer 2215 may be disposed on the first substrate 2210 and at least partially cover the circuit elements 2220a, 2220b, and 2220c, the first metal layers 2230a, 2230b, and 2230c, and the second metal layers 2240a, 2240b, and 2240c. The interlayer insulating layer 2215 may include an insulating material such as silicon oxide, silicon nitride, or the like.

Lower bonding metals 2271b and 2272b may be formed on the second metal layer 2240b in the wordline bonding area WLBA. In the wordline bonding area WLBA, the lower bonding metals 2271b and 2272b in the peripheral region PREG may be electrically bonded to upper bonding metals 2371b and 2372b of the cell region CREG. The lower bonding metals 2271b and 2272b and the upper bonding metals 2371b and 2372b may include aluminum, copper, tungsten, or the like. Further, the upper bonding metals 2371b and 2372b in the cell region CREG may be referred to as first metal pads and the lower bonding metals 2271b and 2272b in the peripheral region PREG may be referred to as second metal pads.

The cell region CREG may include at least one memory block. The cell region CREG may include a second substrate 2310 and a common source line 2320. On the second substrate 2310, wordlines 2331, 2332, 2333, 2334, 2335, 2336, 2337, and 2338 (i.e., 2330) may be vertically stacked (in direction D3 or a Z-axis) perpendicular to an upper surface of the second substrate 2310. At least one string selection line and at least one ground selection line may be arranged on and below the wordlines 2330, respectively, and the wordlines 2330 may be disposed between the at least one string selection line and the at least one ground selection line.

In the bitline bonding area BLBA, a channel structure CH may vertically extend perpendicular to the upper surface of the second substrate 2310. The channel structure CH may pass through the wordlines 2330, the at least one string selection line, and the at least one ground selection line. The channel structure CH may include a data storage layer, a channel layer, a buried insulating layer, and the like, and the channel layer may be electrically connected to a first metal layer 2350c and a second metal layer 2360c. For example, the first metal layer 2350c may be a bitline contact, and the second metal layer 2360c may be a bitline. In an example embodiment, the bitline 2360c may extend in a second horizontal direction D2 (e.g., a Y-axis direction), parallel to the upper surface of the second substrate 2310.

In the example illustrated in FIG. 24, an area in which the channel structure CH, the bitline 2360c, and the like are disposed may be defined as the bitline bonding area BLBA. In the bitline bonding area BLBA, the bitline 2360c may be electrically connected to the circuit elements 2220c, thereby providing a page buffer 2393 in the peripheral region PREG.

The bitline 2360c may be connected to upper bonding metals 2371c and 2372c in the cell region CREG, and the upper bonding metals 2371c and 2372c may be connected to lower bonding metals 2271c and 2272c, which are connected to the circuit elements 2220c of the page buffer 2393.

In the wordline bonding area WLBA, the wordlines 2330 may extend in a first horizontal direction D1 (e.g., an X-axis direction), parallel to the upper surface of the second substrate 2310 and perpendicular to the second horizontal direction D2, and may be connected to cell contact plugs 2341, 2342, 2343, 2344, 2345, 2346, and 2347 (i.e., 2340). The wordlines 2330 and the cell contact plugs 2340 may be connected to each other by pads provided by at least a portion of the wordlines 2330 extending in different lengths in the first horizontal direction D1. A first metal layer 2350b and a second metal layer 2360b may be connected to an upper portion of the cell contact plugs 2340 which are sequentially connected to the wordlines 2330. The cell contact plugs 2340 may be connected to the peripheral region PREG by the upper bonding metals 2371b and 2372b of the cell region CREG and the lower bonding metals 2271b and 2272b of the peripheral region PREG in the wordline bonding area WLBA.

The cell contact plugs 2340 may be electrically connected to the circuit elements 2220b forming a row decoder 2394 in the peripheral region PREG. In an example embodiment, operating voltages of the circuit elements 2220b forming the row decoder 2394 may be different than operating voltages of the circuit elements 2220c forming the page buffer 2393. For example, operating voltages of the circuit elements 2220c forming the page buffer 2393 may be greater than operating voltages of the circuit elements 2220b forming the row decoder 2394.

A common source line contact plug 2380 may be disposed in the external pad bonding area PA. The common source line contact plug 2380 may include a conductive material such as a metal, a metal compound, polysilicon, or the like, and may be electrically connected to the common source line 2320. A first metal layer 2350a and a second metal layer 2360a may be sequentially stacked on an upper portion of the common source line contact plug 2380. For example, an area in which the common source line contact plug 2380, the first metal layer 2350a, and the second metal layer 2360a are disposed may be defined as the external pad bonding area PA.

I/O pads 2205 and 2305 may be disposed in the external pad bonding area PA. A lower insulating film 2201 at least partially covering a lower surface of the first substrate 2210 may be disposed below the first substrate 2210, and a first I/O pad 2205 may be disposed on the lower insulating film 2201. The first I/O pad 2205 may be connected to at least one of the circuit elements 2220a, 2220b, and 2220c disposed in the peripheral region PREG through a first I/O contact plug 2203, and may be separated from the first substrate 2210 by the lower insulating film 2201. In addition, a side insulating film may be disposed between the first I/O contact plug 2203 and the first substrate 2210 to electrically separate the first I/O contact plug 2203 and the first substrate 2210.

An upper insulating film 2301 at least partially covering the upper surface of the second substrate 2310 may be formed on the second substrate 2310, and a second I/O pad 2305 may be disposed on the upper insulating layer 2301. The second I/O pad 2305 may be connected to at least one of the circuit elements 2220a, 2220b, and 2220c disposed in the peripheral region PREG through a second I/O contact plug 2303. In some embodiments, the second I/O pad 2305 may be electrically connected to a circuit element 2220a.

In some embodiments, the second substrate 2310 and the common source line 2320 may not be disposed in an area in which the second I/O contact plug 2303 is disposed. Additionally or alternatively, the second I/O pad 2305 may not overlap the wordlines 2330 in the vertical direction D3 (e.g., the Z-axis direction). The second I/O contact plug 2303 may be separated from the second substrate 2310 in the first direction, parallel to the upper surface of the second substrate 310, and may pass through the interlayer insulating layer 2315 of the cell region CREG to be connected to the second I/O pad 2305.

The first I/O pad 2205 and the second I/O pad 2305 may be selectively formed in different embodiments. For example, the memory device 2000 may include only the first I/O pad 2205 disposed on the first substrate 2210 or the second I/O pad 2305 disposed on the second substrate 2310. Alternatively, the memory device 200 may include both the first I/O pad 2205 and the second I/O pad 2305.

A metal pattern on an uppermost metal layer may be provided as a dummy pattern or the uppermost metal layer may be absent, in each of the external pad bonding area PA and the bitline bonding area BLBA, which are respectively included in the cell region CREG and the peripheral region PREG.

In the external pad bonding area PA, the memory device 2000 may include a lower metal pattern 2273a, corresponding to an upper metal pattern 2372a disposed in an uppermost metal layer of the cell region CREG. The lower metal pattern 2273a may have the same cross-sectional shape as and be connected to the upper metal pattern 2372a of the cell region CREG in an uppermost metal layer of the peripheral region PREG. In the peripheral region PREG, the lower metal pattern 2273a disposed in the uppermost metal layer of the peripheral region PREG may not be connected to a contact. In similar manner, in the external pad bonding area PA, an upper metal pattern 2372a, corresponding to the lower metal pattern 2273a disposed in an uppermost metal layer of the peripheral region PREG, and having the same shape as a lower metal pattern 2273a of the peripheral region PREG, may be disposed in an uppermost metal layer of the cell region CREG.

The lower bonding metals 2271b and 2272b may be disposed on the second metal layer 2240b in the wordline bonding area WLBA. In the wordline bonding area WLBA, the lower bonding metals 2271b and 2272b of the peripheral region PREG may be electrically connected to the upper bonding metals 2371b and 2372b of the cell region CREG by a Cu-to-Cu bonding.

In the bitline bonding area BLBA, an upper metal pattern 2392, corresponding to a lower metal pattern 2252 disposed in the uppermost metal layer of the peripheral region PREG, and having the same cross-sectional shape as the lower metal pattern 2252 of the peripheral region PREG, may be disposed in an uppermost metal layer of the cell region CREG. A contact may not be formed on the upper metal pattern 2392 disposed in the uppermost metal layer of the cell region CREG.

As illustrated in FIG. 25, according to certain embodiments of the inventive concept, the nonvolatile memory device 2000 may include a source line vertical contact SVVC disposed in the contact region VCR. The contact region VCR may correspond to one of the first vertical contact region VCR1 and the second vertical contact region VCR2 as described above. Each source line vertical contact SVVC may be connected to the source line 2320 disposed in the top portion of the cell region CREG to provide the source voltage to the source line 2320.

Figure 26:
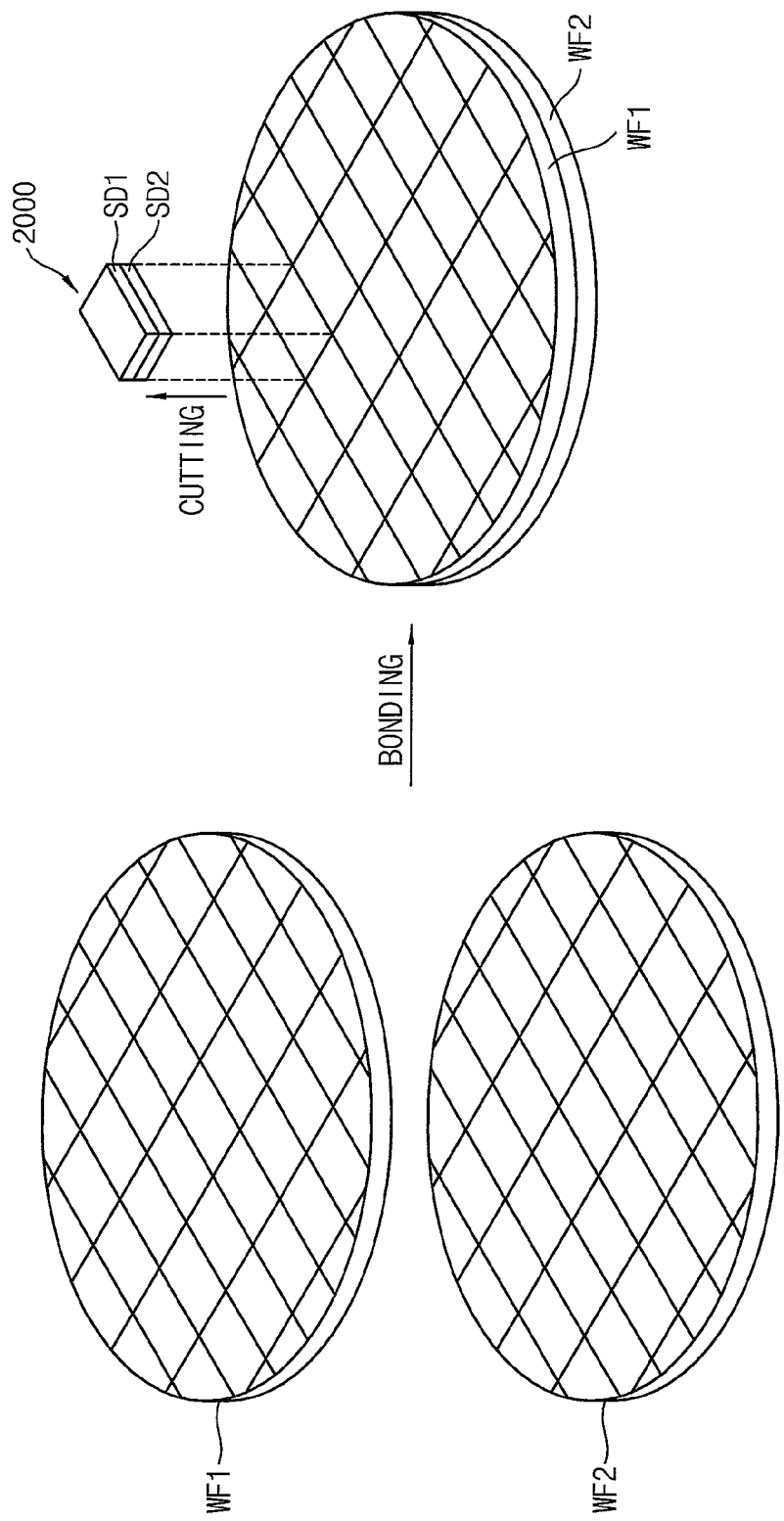
FIG. 26 is a conceptual diagram for describing manufacturing processes of a stacked semiconductor device according to example embodiments.

FIG. 26 is a conceptual diagram for describing manufacturing processes of a stacked semiconductor device according to example embodiments.

Referring to FIG. 26, respective integrated circuits may be formed on a first wafer WF1 and a second wafer WF2. The above-described memory cell array CH and the vertical contacts BLVC and SVVC may be formed in the first wafer WF1 and the peripheral circuits may be formed in the second wafer WF2.

After the various integrated circuits have been respectively formed on the first and second wafers WF1 and WF2, the first wafer WF1 and the second wafer WF2 may be bonded together. The bonded wafers WF1 and WF2 may then be cut (or divided) into chips, wherein each chip corresponds to the memory device 2000 of FIGS. 24 and 25 including a first semiconductor die SD1 that is stacked vertically with a second semiconductor die SD2 (e.g., the first semiconductor die SD1 is stacked on the second semiconductor die SD2, etc.). Each cut portion of the first wafer WF1 may correspond to the first semiconductor die SD1 and each cut portion of the second wafer WF2 may correspond to a second semiconductor die SD2.

FIG. 27 is a block diagram illustrating a solid state disk or solid state drive (SSD) according to example embodiments.

Referring to FIG. 27, an SSD 5000 may generally include nonvolatile memory devices 5100 and an SSD controller 5200.

The nonvolatile memory devices 5100 may (optionally) be configured to receive a high voltage VPP. One or more of the nonvolatile memory devices 5100 may be provided as memory device(s) consistent with embodiments of the inventive concept. Accordingly, the nonvolatile memory devices 5100 may include overhead regions adjacent to vertical contact regions and half memory blocks may be disposed in the overhead regions. The memory capacity per unit area may be increased by forming the half memory blocks in the overhead regions that are created adjacent to the vertical contacts.

The SSD controller 5200 is connected to the nonvolatile memory devices 5100 via multiple channels CH1 to CHi. The SSD controller 5200 includes one or more processors 5210, a buffer memory 5220, an error correction code (ECC) circuit 5230, a host interface 5250, and a nonvolatile memory interface 5260. The buffer memory 5220 stores data used to drive the SSD controller 5200. The buffer memory 5220 includes multiple memory lines each storing data or a command. The ECC circuit 5230 calculates error correction code values of data to be programmed at a writing operation and corrects an error of read data using an error correction code value at a read operation. In a data recovery operation, The ECC circuit 5230 corrects an error of data recovered from the nonvolatile memory devices 5100.

The inventive concepts described herein may variously be applied to nonvolatile memory devices and systems including the example nonvolatile memory devices of the present disclosure. For example, the present inventive concepts may be applied to systems such as memory cards, solid state drives (SSD), embedded multimedia cards (eMMC), mobile phones, smart phones, personal digital assistants (PDA), portable multimedia players (PMP), digital cameras, camcorders, personal computers (PC), server computers, workstations, laptop computers, digital TV, set-top boxes, portable game consoles, navigation systems, wearable devices, internet of things (IoT) devices, internet of everything (IoE) devices, e-books, virtual reality (VR) devices, augmented reality (AR) device, etc.

The foregoing embodiments are illustrative of the inventive concept, which is not necessarily limited to the illustrative embodiments. Although multiple embodiments have been described above, those skilled in the art will readily appreciate that many modifications are possible in these embodiments without materially departing from the scope of the inventive concept.

What is claimed is:

1. A nonvolatile memory device having a cell over periphery (COP) structure in which peripheral circuits are disposed in a peripheral region and a memory cell array is disposed in a cell region over the peripheral region, comprising:
a first sub memory plane;
a second sub memory plane disposed adjacent to the first sub memory plane in a row direction;
a first vertical contact region disposed in the cell region of the first sub memory plane, wherein the first vertical contact region is disposed closer to a first end portion of the cell region in a column direction than to a second end portion of the cell region;
a second vertical contact region disposed in the cell region of the second sub memory plane, wherein the second vertical contact region is disposed closer to the second end portion than to the first end portion of the cell region, wherein the second end portion is opposite to the first end portion in a column direction;
a first overhead region disposed in the cell region of the first sub memory plane, wherein the first overhead region is adjacent to the second vertical contact region in the row direction;
a second overhead region disposed M the cell region of the second sub memory plane, wherein the second overhead region is adjacent to the first vertical contact region in the row direction;
vertical contacts disposed in the first vertical contact region and the second contact region and extending in a vertical direction; and
cell channel structures disposed in a main region of the cell region, each cell channel structure including a string selection transistor, memory cells and a ground selection transistor.

2. The nonvolatile memory device of claim 1, wherein the first overhead region includes one or more first half memory blocks, each first half memory block including cell channel structures that correspond to a first half of a page, wherein a page is a unit of a read operation and a write operation, and wherein the second overhead region includes one or more second half memory blocks, each second half memory block including cell channel structures that correspond to a second half of the page.

3. The nonvolatile memory device of claim 2, wherein one of the first half memory blocks and one of the second half memory blocks are selected simultaneously based on a same row address.

4. The nonvolatile memory device of claim 2, wherein the main region of the cell region includes memory blocks, each memory block including cell channel structures that correspond to the page.

5. The nonvolatile memory device of claim 4, wherein, with respect to the memory blocks, the cell channel structures corresponding to a page size are connected to each wordline, and wherein, with respect to the first half memory blocks and the second half memory blocks, the cell channel structures corresponding a half of the page size are connected to each wordline.

6. The nonvolatile memory device of claim 2, wherein a row-directional length and a column-directional length of the first vertical contact region are equal to a row-directional length and a column-directional length of the second vertical contact region, respectively, and a number of the first half memory blocks is equal to a number of the second half memory blocks.

7. The nonvolatile memory device of claim 2, wherein the first half memory blocks and the second half memory blocks are configured as test blocks to test operational characteristics of the nonvolatile memory device.

8. The nonvolatile memory device of claim 2, wherein the first half memory blocks and the second half memory blocks are configured as spare blocks to replace failed memory cells in the cell region.

9. The nonvolatile memory device of claim 2, wherein the first half memory blocks and the second half memory blocks are configured as special blocks to store meta data for controlling the nonvolatile memory device.

10. The nonvolatile memory device of claim 1, wherein the cell region further includes:
   bitlines disposed at a top portion in the vertical direction of the cell region, arranged in the row direction and extending in the column direction; and
   a source line disposed at a bottom portion in the vertical direction of the cell region and extending in the column direction, and
   wherein the cell channel structures are connected between the bitlines and the source lines.

11. The nonvolatile memory device of claim 10, wherein the peripheral region includes:
   a first page buffer region disposed under the first vertical contact region;
   a second page buffer region disposed under the second vertical contact region; and
   page buffers disposed in the first page buffer region and the second page buffer region.

12. The nonvolatile memory device of claim 11, wherein the vertical contacts include bitline vertical contacts connecting the bitlines to the page buffers.

13. The nonvolatile memory device of claim 12, wherein each of the first vertical contact region and the second vertical contact region includes q sub vertical contact regions, where q is an integer greater than one, and
   wherein q bitlines adjacent in the row direction among the bitlines are sequentially connected to q bitline vertical contacts respectively included in the q sub vertical contact regions.

14. The nonvolatile memory device of claim 10, wherein the vertical contacts include one or more source line vertical contacts configured to provide a source voltage to the source line.

15. The nonvolatile memory device of claim 1, further comprising:
   a first test region disposed in the cell region of the first sub memory plane and disposed closer to the first end portion than to the second end portion in the column direction of the cell region;
   a second test region disposed in the cell region of the second sub memory plane and disposed closer to the second end portion than to the first end portion in the column direction of the cell region, wherein the second end portion is on an opposite side of the first end portion in the column direction;
   a third overhead region disposed in the cell region of the first sub memory plane and adjacent to the second test region in the row direction;
   a fourth overhead region disposed in the cell region of the second sub memory plane and adjacent to the first test region in the row direction; and
   test blocks disposed in the first test region and the second test region and configured to test operational characteristics of the nonvolatile memory device.

16. The nonvolatile memory device of claim 15, wherein each of the first through fourth overhead regions includes one or more half memory blocks, each first half memory block including the cell channel structures corresponding to a half of a page wherein a full page is a unit of a read operation and a write operation.

17. A nonvolatile memory device having a cell over periphery (COP) structure in which peripheral circuits are disposed in a peripheral region and a memory cell array is disposed in a cell region over the peripheral region, comprising:
   a first sub memory plane;
   a second sub memory plane disposed adjacent to the first sub memory plane in a row direction;
   a first vertical contact region disposed in the cell region of the first sub memory plane and disposed closer to a first end portion than to a second end portion of the cell region in a column direction;
   a second vertical contact region disposed in the cell region of the second sub memory plane and disposed closer to the second end portion, wherein the second end portion is opposite to the first end portion in a column direction;
   a first overhead region disposed in the cell region of the first sub memory plane and adjacent to the second vertical region in the row direction;
   a second overhead region disposed in the cell region of the second sub memory plane and adjacent to the first vertical region in the row direction;
   bitlines disposed at a top portion in the vertical direction of the cell region, arranged in the row direction and extending in the column direction;
   a source line disposed at a bottom portion in the vertical direction of the cell region and extending in the column direction;
   a first page buffer region disposed under the first vertical contact region;
   a second page buffer region disposed under the second vertical contact region;
   page buffers disposed in the first page buffer region and the second page buffer region;
   bitline vertical contacts disposed in the first vertical contact region and the second contact region and extending in a vertical direction to connect the bitlines and the page buffers, respectively;
   cell channel structures disposed in a main region of the cell region, each cell channel structure including a string selection transistor, memory cells and a ground selection transistor;
   half memory blocks disposed in the first overhead region and the second overhead region, each half memory block including the cell channel structures that correspond to a half of a page, wherein a page is a unit of a read operation and a write operation; and
   memory blocks disposed in the cell region excluding the first vertical contact region, the second vertical contact region, the first overhead region and the second overhead region, each memory block including the cell channel structures corresponding to the page.

18. The nonvolatile memory device of claim 17, wherein one of the half memory blocks in the first overhead region and one of the half memory blocks in the second overhead region are selected simultaneously based on a same row address.

19. A nonvolatile memory device comprising:
first metal pads disposed in a cell region;
second metal pads disposed in a peripheral region under the cell region wherein the peripheral region is vertically connected to the cell region by the first metal pads and the second metal pads;
a first sub memory plane;
a second sub memory plane disposed adjacent to the first sub memory plane in a row direction;
a first vertical contact region disposed in the cell region of the first sub memory plane, wherein the first vertical contact region is disposed closer to a first end portion of the cell region in a column direction than to a second end portion of the cell region;
a second vertical contact region disposed in the cell region of the second sub memory plane, wherein the second vertical contact region is disposed closer to the second end portion than to the first end portion of the cell region, wherein the second end portion is opposite to the first end portion in a column direction;
a first overhead region disposed in the cell region of the first sub memory plane and adjacent to the second vertical region in the row direction;
a second overhead region disposed in the cell region of the second sub memory plane and adjacent to the first vertical region in the row direction;
vertical contacts disposed in the first vertical contact region and the second contact region and extending in a vertical direction; and
cell channel structures disposed in a main region of the cell region, each cell channel structure including as string selection transistor, memory cells and a ground selection transistor.

20. The nonvolatile memory device of claim 19, wherein the first overhead region includes one or more first half memory blocks, each first half memory block including the cell channel structures corresponding to a first half of a page, wherein a page is a unit of a read operation and a write operation, and
wherein the second overhead region includes one or more second half memory blocks, each second half memory block including the cell channel structures corresponding to a second half of the page.

* * * * *